US012727520B2

(12) United States Patent
Lu et al.

(10) Patent No.: US 12,727,520 B2

(45) Date of Patent: Sep. 1, 2026

(54) BACKLIGHT AND DISPLAY SYSTEM

(71) Applicant: 3M INNOVATIVE PROPERTIES COMPANY, St. Paul, MN (US)

(72) Inventors: Yuhsin Lu, Changhua County (TW); Bharat R. Acharya, Woodbury, MN (US); Adam D. Haag, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 302 days.

(21) Appl. No.: 18/550,301

(22) PCT Filed: Apr. 4, 2022

(86) PCT No.: PCT/IB2022/053128

§ 371 (c)(1),
(2) Date: Sep. 13, 2023

(87) PCT Pub. No.: WO2022/214944

PCT Pub. Date: Oct. 13, 2022

(65) Prior Publication Data

US 2024/0162204 A1 May 16, 2024

Related U.S. Application Data

(60) Provisional application No. 63/200,938, filed on Apr. 5, 2021.

(51) Int. Cl.
*H10W 90/00* (2026.01)
*G02B 5/30* (2006.01)
(Continued)

(52) U.S. Cl.
CPC ............ *H10W 90/00* (2026.01); *G02B 5/305* (2013.01); *H10H 20/8514* (2025.01); *H10H 29/142* (2025.01)

(58) Field of Classification Search
CPC .... H01L 25/0753; H10W 90/00; G02B 5/305; B32B 2307/416; B32B 2307/42
See application file for complete search history.

(56) References Cited

U.S. PATENT DOCUMENTS 7,104,776 B2 9/2006 Merrill et al.
9,158,155 B2 10/2015 Weber
(Continued)

FOREIGN PATENT DOCUMENTS

KR 20170018095 A 2/2017
WO 2011139618 A2 11/2011
(Continued)

OTHER PUBLICATIONS

International Search report for PCT International Application No. PCT/IB2022/053128, mailed on Jun. 23, 2022, 7 pages.

*Primary Examiner* — Douglas M Menz
(74) *Attorney, Agent, or Firm* — Clifton F. Richardson; Theresa R. Stadheim

(57) ABSTRACT

A backlight includes a plurality of light sources, a reflective polarizer disposed on the plurality of light sources, and an optical film disposed between the reflective polarizer and the plurality of discrete spaced apart light sources. For a substantially collimated incident light, for a visible wavelength range, and for a first incident angle of less than about 5 degrees, the reflective polarizer has an average optical reflectance of at least 60% when the incident light is p-polarized and an average optical transmittance of at least 60% when the incident light is s-polarized. For the average of p-polarized and s-polarized incident lights and the visible wavelength range, the optical film has an average optical transmittance T1 for the first incident angle, and an average transmittance T2 for a second incident angle of greater than about 35 degrees, such that $T1/T2 \geq 1.5$.

12 Claims, 12 Drawing Sheets

(51) Int. Cl.
*H10H 20/851* (2025.01)
*H10H 29/14* (2025.01)

(56) References Cited

U.S. PATENT DOCUMENTS

| | | | | |
|---|---|---|---|---|
| 2007/0047080 | A1 | 3/2007 | Stover et al. | |
| 2015/0124194 | A1 | 5/2015 | Oya et al. | |
| 2016/0195659 | A1* | 7/2016 | Johnson | G02B 5/3041 359/489.11 |
| 2016/0223732 | A1 | 8/2016 | Jeon et al. | |
| 2018/0059482 | A1 | 3/2018 | Li et al. | |
| 2019/0285950 | A1* | 9/2019 | Liu | H05K 3/3431 |
| 2019/0339433 | A1 | 11/2019 | Benoit | |
| 2020/0019019 | A1 | 1/2020 | Liu et al. | |
| 2020/0183065 | A1 | 6/2020 | Haag et al. | |

FOREIGN PATENT DOCUMENTS

| | | | |
|---|---|---|---|
| WO | 2018063961 | A1 | 4/2018 |
| WO | 2018160304 | A1 | 9/2018 |
| WO | 2019067095 | A1 | 4/2019 |
| WO | 2019177755 | A1 | 9/2019 |
| WO | 2021024078 | A1 | 2/2021 |

* cited by examiner

| avg %T | 0 | 10 | 20 | 30 | 40 | 50 | 60 |
|---|---|---|---|---|---|---|---|
| 80 (about 420 nm to 680 nm) | 24.2 | 23.2 | 21.2 | 17.4 | 13.3 | 8.5 | 4.8 |
| 81 (about 700 nm to 780 nm) | 17.1 | 15.7 | 12.8 | 12.0 | 21.0 | 37.3 | 44.5 |

| | 80 (about 420 nm to 680 nm) | 81 (about 700 nm to 780 nm) |
|---|---|---|
| 0/30 | 1.4 | 1.4 |
| 0/40 | 1.8 | 0.8 |
| 0/50 | 2.8 | 0.5 |
| 0/60 | 5.1 | 0.4 |

130
131
132
120
20
30
100a 100b
101 x
y
z 130
131
133
133
132

130
131
132a
132
132

132b
132
x
z
y
x
z
y

BACKLIGHT AND DISPLAY SYSTEM

CROSS REFERENCE TO RELATED APPLICATIONS

This application is a national stage filing under 35 U.S.C. 371 of PCT/IB2022/053128, filed Apr. 4, 2022, which claims the benefit of U.S. Application No. 63/200,938, filed Apr. 5, 2021, the disclosures of which are incorporated by reference in their entirety herein.

TECHNICAL FIELD

The present disclosure relates generally to a backlight for providing illumination to a display panel, and a display system including the display panel disposed on the backlight.

BACKGROUND

Electronic devices, such as smart phones, tablet computers, personal computers, music players, etc., often include displays. For example, the electronic devices may be provided with a liquid crystal display (LCD) panel. Liquid crystal displays typically use light-modulating properties of liquid crystals. The liquid crystals do not emit light directly and a backlight unit is used to illuminate the LCD panel to produce images in color or monochrome. Thus, the backlight unit provides illumination to the LCD panel.

SUMMARY

In a first aspect, the present disclosure provides a backlight for providing illumination to a display panel. The backlight includes a plurality of discrete spaced apart light sources arranged two-dimensionally on an optically reflective surface. The backlight further includes a reflective polarizer disposed on the plurality of discrete spaced apart light sources. The backlight further includes an optical film disposed between, and substantially co-extensive in length and width with, the reflective polarizer and the plurality of discrete spaced apart light sources. Each of the reflective polarizer and the optical film includes a plurality of polymeric layers numbering at least 10 in total. Each of the polymeric layers has an average thickness of less than about 500 nm. For a substantially collimated incident light propagating in an incident plane, for a visible wavelength range extending from about 420 nanometers (nm) to about 680 nm, and for a first incident angle of less than about 5 degrees, the plurality of polymeric layers of the reflective polarizer has an average optical reflectance of at least 60% when the incident light is p-polarized and an average optical transmittance of at least 60% when the incident light is s-polarized. For the substantially collimated incident light propagating in the incident plane, for the visible wavelength range, for the first incident angle, and for the average of p-polarized and s-polarized incident lights, the plurality of polymeric layers of the optical film has an average optical transmittance T1. For the substantially collimated incident light propagating in the incident plane, for the visible wavelength range, for a second incident angle of greater than about 35 degrees, and for the average of p-polarized and s-polarized incident lights, the plurality of polymeric layers of the optical film has an average optical transmittance T2, $T1/T2 \geq 1.5$.

In a second aspect, the present disclosure provides a display system including a display panel disposed on the backlight of the first aspect.

In a third aspect, the present disclosure provides a display system. The display system includes a plurality of discrete spaced apart light sources arranged two-dimensionally on an optically reflective surface. The display system further includes a display panel disposed on the light sources and configured to form an image. The display system further includes a reflective polarizer disposed between the display panel and the light sources. The display system further includes an optical film disposed between, and substantially co-extensive in length and width with, the reflective polarizer and the light sources. Each of the reflective polarizer and the optical film includes a plurality of polymeric layers numbering at least 10 in total. Each of the polymeric layers has an average thickness of less than about 500 nm. A visible wavelength range extends from about 420 nm to about 680 nm. An infrared wavelength range extends from about 700 nm to about 780 nm. For a substantially collimated incident light propagating in an incident plane, for a first incident angle of less than about 5 degrees, and the visible wavelength, the plurality of polymeric layers of the reflective polarizer has an average optical reflectance of at least 60% when the incident light is p-polarized and an average optical transmittance of at least 60% when the incident light is s-polarized. For the substantially collimated incident light propagating in the incident plane, for the first incident angle, and for the average of p-polarized and s-polarized incident lights, the plurality of polymeric layers of the optical film has an optical transmittance T1a at least one visible wavelength in the visible wavelength range and an optical transmittance T1b at at least one infrared wavelength in the infrared wavelength range. For the substantially collimated incident light propagating in the incident plane, for a second incident angle of greater than about 35 degrees, and for the average of p-polarized and s-polarized incident lights, the plurality of polymeric layers of the optical film has an optical transmittance T1c at the at least one visible wavelength and an optical transmittance T1d at the at least one infrared wavelength, $T1a/T1c \geq 1.5$, $T1b/T1d \leq 0.7$.

BRIEF DESCRIPTION OF THE DRAWINGS

Exemplary embodiments disclosed herein may be more completely understood in consideration of the following detailed description in connection with the following figures. The figures are not necessarily drawn to scale. Like numbers used in the figures refer to like components. However, it will be understood that the use of a number to refer to a component in a given figure is not intended to limit the component in another figure labeled with the same number.

DETAILED DESCRIPTION

Figure 1:
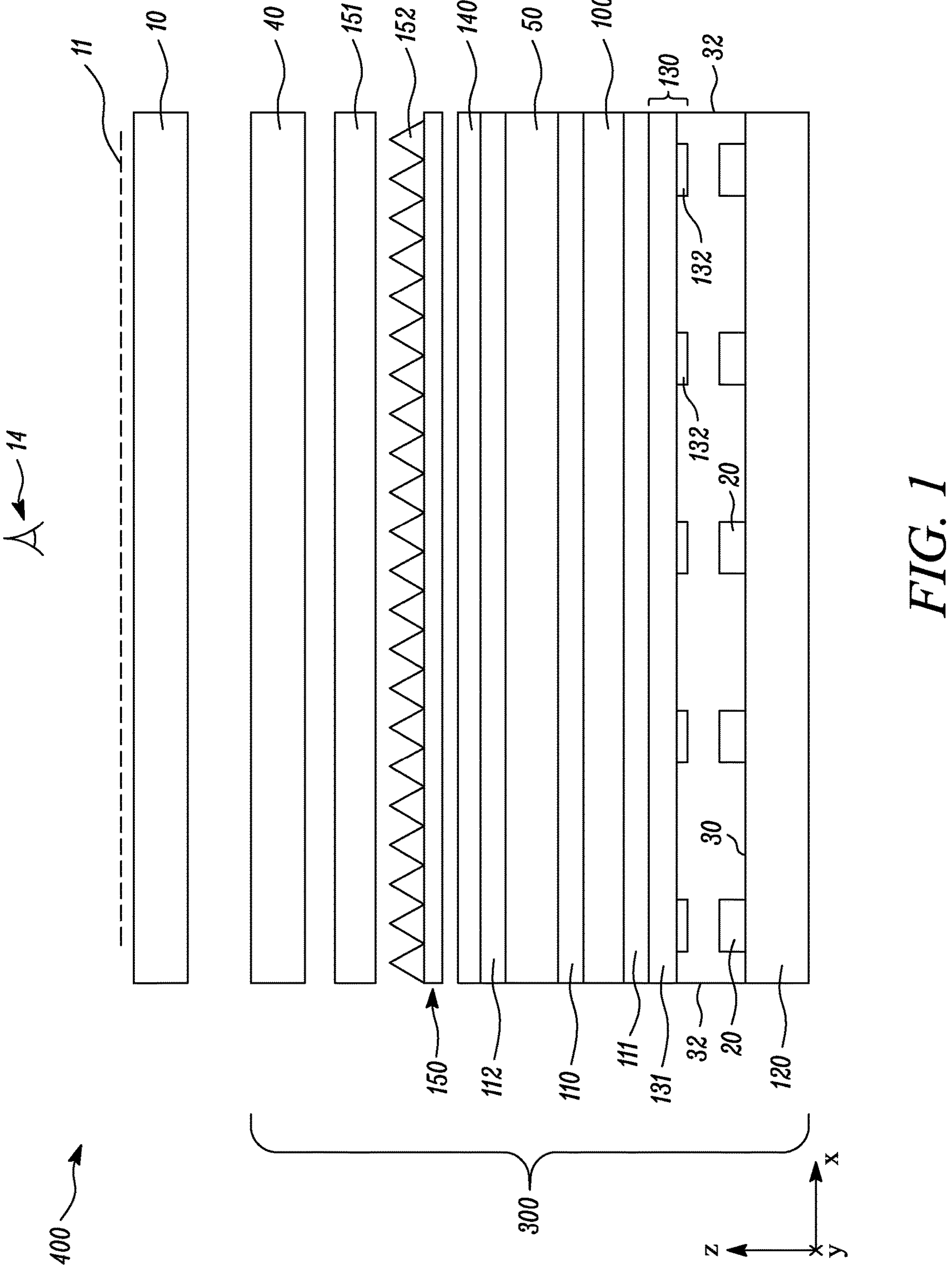
FIG. 1 illustrates a schematic side view of a display system, according to an embodiment of the present disclosure.

In the following description, reference is made to the accompanying figures that form a part thereof and in which various embodiments are shown by way of illustration. It is to be understood that other embodiments are contemplated and may be made without departing from the scope or spirit of the present disclosure. The following detailed description, therefore, is not to be taken in a limiting sense.

As used herein, the term "film" generally refers to a material with a very high ratio of length or width to thickness. A film has two major surfaces defined by a length and width. Films typically have good flexibility and can be used for a wide variety of applications, including displays. Films may also be of thickness or material composition, such that they are semi-rigid or rigid. Films described in the present disclosure may be composed of various polymeric materials. Films may be monolayer or multilayer or blend of different polymers.

As used herein, the term "optical film" generally refers to a film that can be used to produce an optical effect. Optical films are typically at least partially transmissive, reflective, antireflective, polarizing, optically clear, and/or diffusive for certain wavelengths of the electromagnetic spectrum (e.g., wavelengths in the visible, ultraviolet, or infrared regions of the electromagnetic spectrum).

As used herein, the term "layer" generally refers to a thickness of material within a film that has a relatively consistent chemical composition. Layers may be of any type of material including polymeric, cellulosic, metallic, or a blend thereof. A given polymeric layer may include a single polymer-type or a blend of polymers and may be accompanied by additives. A given layer may be combined or connected to other layers to form films. A layer may be either partially or fully continuous as compared to adjacent layers or the film. A given layer may be partially or fully coextensive with adjacent layers. A layer may contain sub-layers.

As used herein, the term "adhesive" generally refers to polymeric compositions useful to adhere together two adherends. Examples of adhesives may include curable adhesives, heat activated adhesives, pressure sensitive adhesives, or combinations thereof.

As used herein, the term "diffuser" generally refers to any film, layer or substrates that are designed to scatter light. This light diffusion may be affected, for example, through use of a textured surface of the substrate, or through other means such as incorporation of light scattering particles within a matrix of the film. While it is noted that all optical articles can be considered to scatter light to some extent, substrates and films that are optically transparent or optically clear are not considered to be "light scattering" unless some light scattering property is imparted to these substrates or films.

As used herein, the term "specularly reflective" generally refers to a concept that can be described with reference to a term "specular reflection". "Specular reflection" or "specularly reflected" refers to mirror-like reflection of light whereupon light from a single incident direction is reflected from a surface into a single outgoing direction, with both directions making the same angle with respect to a normal to the surface. "Specular reflectance" refers to a fraction, expressed as a percent, of incoming light intensity that is specularly reflected by the surface. Specular reflectance can be a function of the wavelength of the incident light.

As used herein, the term "diffusely reflective" generally refers to a concept that can be described with reference to the term "diffuse reflection". Diffuse reflection or diffusely reflected refers to non-specular reflection of light whereupon light from a single incident direction is reflected from a surface into outgoing directions that do not include the specular direction. "Diffuse reflectance" refers to a fraction, expressed as a percent, of incoming light intensity that is diffusely reflected by the surface. Diffuse reflectance can be a function of a wavelength of the incident light.

The present disclosure relates generally to a backlight for providing illumination to a display panel, and a display system including the display panel disposed on the backlight.

The backlight may be used in electronic devices that include displays, such as computer monitors, televisions, mobile phones, personal digital assistants (PDAs), laptops, wearable devices and other portable devices. The backlight may also be used with displays for automotive applications. In some cases, the backlight may be incorporated in the display system.

Current display systems may typically include either direct-lit backlight units or edge-lit backlight units for providing illumination to a display panel. The edge-lit backlight units typically include light sources that emit light into an edge of a lightguide. The lightguide guides the emitted light from the light sources and directs the emitted light toward the display panel. The direct-lit backlight units typically include an array of light sources that emit light vertically toward the display panel. However, the direct-lit backlight units are generally bulky and may produce non-uniform backlight illumination.

The backlight of the present disclosure provides illumination to a display panel. The backlight includes a plurality of discrete spaced apart light sources arranged two-dimensionally on an optically reflective surface. The backlight further includes a reflective polarizer disposed on the plurality of discrete spaced apart light sources. The backlight further includes an optical film disposed between, and substantially co-extensive in length and width with, the reflective polarizer and the plurality of discrete spaced apart light sources. Each of the reflective polarizer and the optical film includes a plurality of polymeric layers numbering at least 10 in total. Each of the polymeric layers has an average thickness of less than about 500 nm. For a substantially collimated incident light propagating in an incident plane, for a visible wavelength range extending from about 420 nanometers (nm) to about 680 nm, and for a first incident angle of less than about 5 degrees, the plurality of polymeric layers of the reflective polarizer has an average optical reflectance of at least 60% when the incident light is p-polarized and an average optical transmittance of at least 60% when the incident light is s-polarized. For the substantially collimated incident light propagating in the incident plane, for the visible wavelength range, for the first incident angle, and for the average of p-polarized and s-polarized incident lights, the plurality of polymeric layers of the optical film has an average optical transmittance T1. For the substantially collimated incident light propagating in the incident plane, for the visible wavelength range, for a second incident angle of greater than about 35 degrees, and for the average of p-polarized and s-polarized incident lights, the plurality of polymeric layers of the optical film has an average optical transmittance T2, $T1/T2 \geq 1.5$.

For the visible wavelength range, the optical film therefore has the average transmittance for the substantially collimated incident light propagating in the incident plane and incident at the first incident angle of less than about 5 degrees (i.e., substantially normally incident light or on-axis light) greater than the average transmittance for the substantially collimated incident light propagating in the incident plane P and incident at the second incident angle of greater than about 35 degrees (i.e., an off-axis light). Therefore, for the visible wavelength range, the optical film may have a greater reflectance for the substantially collimated incident light propagating in the incident plane and incident at the second incident angle. Thus, for the visible wavelength range, the optical film may substantially reflect the substantially collimated incident light propagating in the incident plane and incident at the second incident angle back toward the optically reflective surface of the backlight. The optical film may act as a collimating multilayer optical film (CMOF) with a greater transmittance for the on-axis light than the off-axis light.

Reflected light from the optical film may be recycled by the optically reflective surface of the backlight. The optically reflective surface may redirect the reflected light toward the optical film until the redirected light is substantially normally incident on the optical film (i.e., incident along a direction closer to an on-axis of the backlight). The optical film of the backlight of the present disclosure may therefore at least partially collimate and recycle the off-axis light generated by the plurality of discrete spaced apart light sources or the off-axis light redirected by the optically reflective surface, between the optical film and the optically reflective surface of the backlight. The increased recycling may therefore result in improved light use efficiency and increased brightness of illumination from the backlight. Further, the recycling of the off-axis light may further improve a uniformity of backlight illumination. This may further help in reducing a thickness of the backlight since the backlight exhibits good performance balance between brightness, uniformity and light use efficiency compared to other backlights with similar thickness.

FIG. 1 illustrates a schematic side view of a display system 400 according to an embodiment of the present disclosure. Specifically, FIG. 1 shows a sectional side view of the display system 400. The display system 400 may be configured to display content, such as text and/or graphics.

The display system 400 defines mutually orthogonal x, y, and z-axes. The x and y-axes are in-plane axes of the display system 400, while the z-axis is a transverse axis disposed along a thickness of the display system 400. In other words, the x and y-axes are disposed along a plane of the display system 400, while the z-axis is perpendicular to the plane of the display system 400.

In some embodiments, the display system 400 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.). In some other embodiments, the display system 400 may be a display that is not touch-sensitive.

The display system 400 includes a backlight 300 and a display panel 10. The backlight 300 provides illumination to the display panel 10. The display system 400 includes a plurality of discrete spaced apart light sources 20 arranged two-dimensionally on an optically reflective surface 30. Specifically, the backlight 300 includes the plurality of discrete spaced apart light sources 20 arranged two-dimensionally on the optically reflective surface 30. In some embodiments, the plurality of discrete spaced apart light sources 20 are arranged substantially along the x-axis and the y-axis. In some embodiments, "plurality of discrete spaced apart light sources 20" may be interchangeably referred to as "light sources 20".

In some embodiments, the display system 400 includes the display panel 10 disposed on the backlight 300. Specifically, the display system 400 includes the display panel 10 disposed on the light sources 20 and configured to form an image 11. In some embodiments, the display panel 10 may selectively transmit or block light to form the image 11 for viewing by a user 14. In some embodiments, the display panel 10 includes a liquid crystal display (LCD) panel. In some embodiments, the display panel 10 may include a plurality of individually addressable pixels (not shown). In some embodiments, the display panel may be, partly or entirely, a touch sensitive display panel configured to receive contact inputs from the user 14. Accordingly, the display system 400 may receive touch inputs from the user 14.

In some embodiments, the light sources 20 may include one or more light emitters that emit light. In some embodiments, at least one of the light sources 20 in the plurality of discrete spaced apart light sources 20 includes a light emitting diode (LED). In some other embodiments, at least one of the light sources 20 in the plurality of discrete spaced apart light sources 20 may include any other type of light emitters, for example, fluorescent lights, or any other suitable light emitting device. In some embodiments, the light sources 20 may be controlled in unison by a control circuitry (not shown) of the display system 400 or may be individually controlled.

In some embodiments, the light sources 20 may emit light of any suitable color (e.g., blue, red, green, white, etc.). In some other embodiments, the light sources 20 may be monochromatic or may include a number of light emitters operating at different wavelengths in order to produce a white light output. In some embodiments, the plurality of discrete spaced apart light sources 20 includes one or more of a blue light emitting light source, a green light emitting light source, a red light emitting light source, and a white light emitting light source. In some embodiments, each light source 20 in the plurality of discrete spaced apart light source 20 is a blue light emitting light source emitting only blue light. In some embodiments, the light sources 20 may be encapsulated by any suitable encapsulant. In some embodiments, the encapsulant may be air. In some embodiments, the encapsulant may also include phosphorescent materials or other color conversion materials.

In some embodiments, the backlight 300 includes a circuit board 120 including the optically reflective surface 30. In some embodiments, the LEDs may be mounted on the circuit board 120. Light from the light sources 20 may be reflected from the optically reflective surface 30. Further, light reflected from the optically reflective surface 30 may illuminate the display panel 10. In some embodiments, the backlight 300 may include side reflectors 32 surrounding at least a portion of a periphery of the backlight 300. The side reflectors 32 may reflect light received at an edge portion of the backlight 300 from the optically reflective surface 30.

In some embodiments, the optically reflective surface 30 is primarily specularly reflective having a specular optical reflectance of greater than about 70% for at least one wavelength in a visible wavelength range 80 (shown in FIGS. 4 and 6) extending from about 420 nanometers (nm) to about 680 nm. In some embodiments, the optically reflective surface 30 has a specular optical reflectance of greater than about 80% for at least one wavelength in the visible wavelength range 80. In some embodiments, the optically reflective surface 30 is primarily diffusely reflective having a diffuse optical reflectance of greater than about 70% for at least one wavelength in the visible wavelength range 80. In some embodiments, the optically reflective surface 30 has the diffuse optical reflectance of greater than about 80% for at least one wavelength in the visible wavelength range 80. In some embodiments, the optically reflective surface 30 may include a metallic surface. In some embodiments, the optically reflective surface 30 may include one or more elements, such as silver, aluminum, a white coating, a non-conductive coating, etc. In some embodiments, the optically reflective surface 30 may be useful for recycling light within the display system 400. For example, the optically reflective surface 30 may recycle light generated by the light sources 20. This may result in improved light use efficiency and increased brightness.

The display system 400 further includes a reflective polarizer 40 disposed between the display panel 10 and the light sources 20. Specifically, the backlight 300 includes the reflective polarizer 40 disposed on the plurality of discrete spaced apart light sources 20. In some embodiments, the reflective polarizer 40 may substantially allow light of a specific polarization to pass through while substantially blocking light of an orthogonal polarization.

Figure 2:
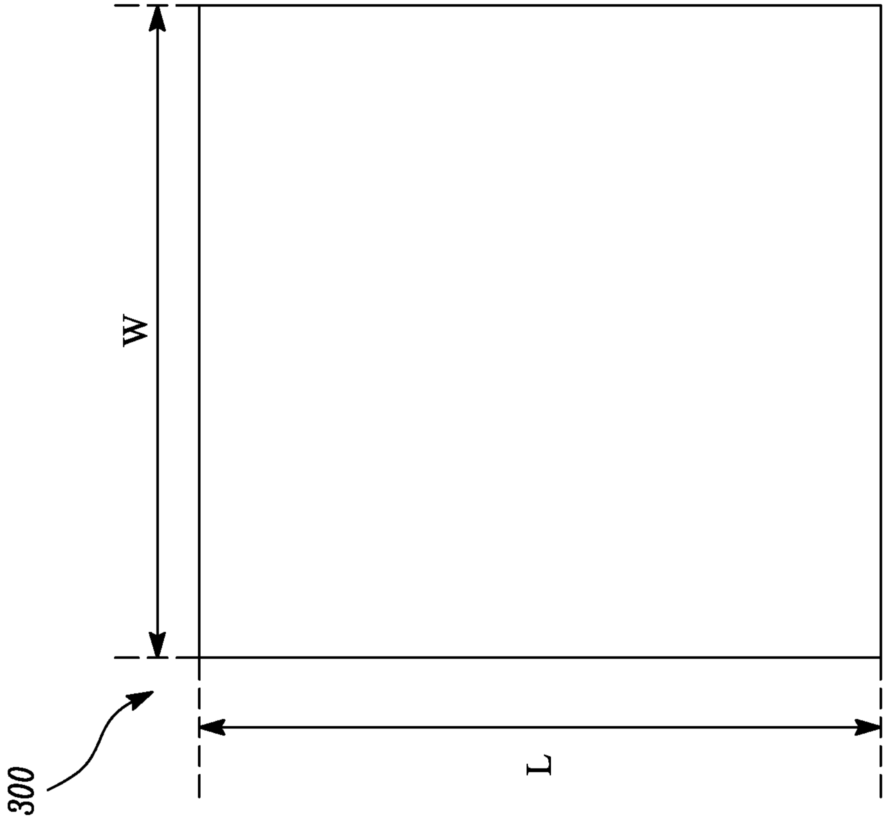
FIG. 2 illustrates a schematic top view of a backlight, according to an embodiment of the present disclosure.
Figure 2:
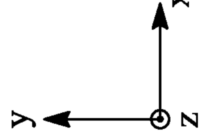

FIG. 2 illustrates a schematic top view of the backlight 300. The backlight 300 extends along the x-y plane with a length L substantially along the y-axis and a width W substantially along the x-axis. Various components of the display system 400 (shown in FIG. 1) and the backlight 300 may be co-extensive in the length L and the width W of the backlight 300.

Referring to FIGS. 1 and 2, the display system 400 further includes an optical film 50 disposed between, and substantially co-extensive in the length L and the width W with, the reflective polarizer 40 and the light sources 20. Specifically, the backlight 300 includes the optical film 50 disposed between, and substantially co-extensive in the length L and the width W with, the reflective polarizer 40 and the plurality of discrete spaced apart light sources 20. The reflective polarizer 40 and the optical film 50 will be described in detail later with reference to FIGS. 3 and 5. Each of the reflective polarizer 40 and the optical film 50 includes a plurality of polymeric layers (not shown in FIG. 1) numbering at least 10 in total. In some embodiments, each of the reflective polarizer 40 and the optical film 50 includes the plurality of polymeric layers numbering at least 50, at least 100, at least 200, at least 300, at least 400, or at least 500 in total.

In some embodiments, the backlight 300 further includes a light converting component 100 disposed between the optical film 50 and the plurality of discrete spaced apart light sources 20. In some embodiments, the light converting component 100 is a light converting film 100 substantially co-extensive in the length L and the width W with the plurality of discrete spaced apart light sources 20. In some embodiments, "light converting component 100" may be interchangeably used hereinafter as "light converting film 100". In some embodiments, a first bonding layer 110 bonds the light converting film 100 to the optical film 50. In some embodiments, the first bonding layer 110 may include an optically clear adhesive layer or an epoxy layer for bonding the light converting film 100 to the optical film 50.

In some embodiments, the light converting component 100 may be configured to convert light from the light sources 20 from one color to a different color. In some embodiments, the light converting component 100 is configured to convert at least a portion of the blue light emitted by the blue light emitting light sources (e.g., one or more of the light sources 20) to a green light and convert at least a portion of the blue light emitted by the blue light emitting light sources to a red light. In some embodiments, the light converting component 100 includes one or more of phosphor, fluorescent dye, and quantum dots. For example, when the light sources 20 emit blue light, phosphor (e.g., a layer of phosphor material or other photoluminescent material) in the light converting component 100 may convert at least a portion of the blue light to the green light or at least a portion of the blue light into the red light.

In some embodiments, the backlight 300 further includes a first optically diffusive layer 130 disposed between, and substantially co-extensive in the length L and the width W with, the optical film 50 and the plurality of discrete spaced apart light sources 20. In some embodiments, the first optically diffusive layer 130 is configured to scatter light. In some embodiments, the first optically diffusive layer 130 includes a plurality of discrete spaced apart optically diffusive portions 132 disposed on a first substrate 131. In some embodiments, the diffusive portions 132 are disposed between the first substrate 131 and the light sources 20. In some embodiments, the diffusive portions 132 and the light sources 20 are aligned to each other in a one-to-one correspondence. In some embodiments, the first optically diffusive layer 130 may diffuse light received from the light sources 20. Specifically, light emitted by the light sources 20 is received by the first optically diffusive layer 130 and is scattered by the diffusive portions 132 of the first optically diffusive layer 130. Thus, the first optically diffusive layer 130 may improve a uniformity of light emitted by the plurality of discrete spaced apart light sources 20.

In some embodiments, the light converting component 100 and the first optically diffusive layer 130 are disposed between the optical film 50 and the light sources 20. In some embodiments, a second bonding layer 111 bonds the light converting component 100 to the first optically diffusive layer 130. In some embodiments, the second bonding layer 111 may include an optically clear adhesive layer or an epoxy layer for bonding the light converting component 100 to the first optically diffusive layer 130. In some embodiments, the second bonding layer 111 is substantially similar to the first bonding layer 110.

In some embodiments, the backlight 300 further includes a second optically diffusive layer 140 disposed between the reflective polarizer 40 and the optical film 50. In some embodiments, the second optically diffusive layer 140 may be substantially similar to the first optically diffusive layer 130. In some embodiments, the backlight 300 further includes a third bonding layer 112 bonding the second optically diffusive layer 140 to the optical film 50. In some embodiments, the third bonding layer 112 may include an optical adhesive layer or an epoxy layer for bonding the second optically diffusive layer 140 to the optical film 50. In some embodiments, the third bonding layer 112 may be substantially similar to the first bonding layer 110 and/or the second bonding layer 111.

In some embodiments, the backlight 300 further includes at least one light redirecting film 150, 151 disposed between the reflective polarizer 40 and the optical film 50. In the illustrated embodiment of FIG. 1, the at least one light redirecting film 150, 151 includes two light redirecting films 150, 151. In some embodiments, the at least one light redirecting film 150, 151 redirects at least one of a recycling light and a collimating light received from the optical film 50. In some embodiments, at least one of the at least one light redirecting film 150, 151 (e.g., the light redirecting film 150) includes a plurality of substantially parallel linear prisms 152 extending along a first direction and arranged along a different second direction. In some embodiments, the first direction may be substantially along the y-axis and the second direction may be substantially along the x-axis. In some embodiments, at least one of the at least one light redirecting film 150, 151 may enhance a brightness of an image (e.g., the image 11) formed by the display panel 10. In some embodiments, the two light redirecting films 150, 151 may be crossed prism films. Therefore, the linear prisms 152 of the light redirecting film 150 may be substantially orthogonal to the linear prisms (not shown) of the light redirecting film 151.

In some embodiments, various components of the display system 400 and the backlight 300 are disposed along the z-axis. In some embodiments, the display system 400 may further include other light management layers. These layers may be used for spatial mixing or color mixing of light, light source hiding, and uniformity improvement. Layers that may be used for these purposes include, but are not limited to, diffuser films, diffuser plates, partially reflective layers, color-mixing lightguides or films, and non-Gaussian diffusers (diffusing systems in which a peak brightness ray of diffused light propagates in a direction that is not parallel to a direction of the peak brightness ray of input light). In some embodiments, the layers may include one or more color filter layers, polarizer layers, micro-structured layers, etc., or combinations thereof. In some embodiments, the display system 400 may further include a cover layer (not shown) disposed on the display panel 10. The cover layer may provide protection to the various layers of the display system 400.

Figure 3:
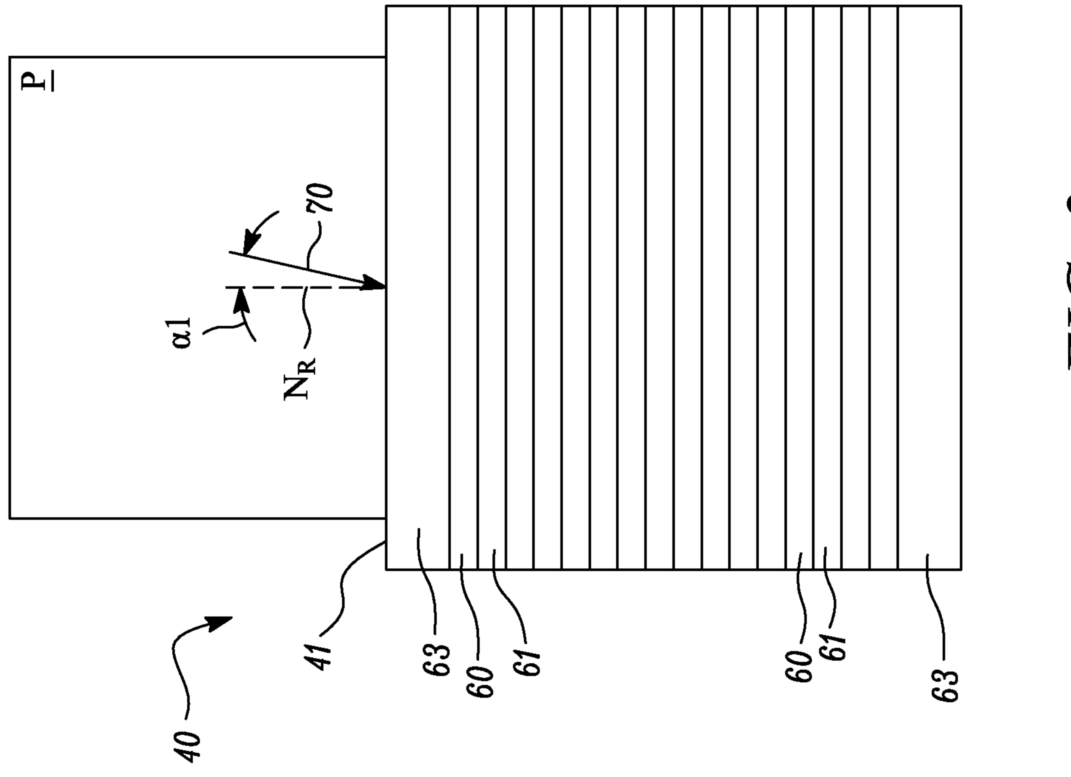
FIG. 3 illustrates a schematic side view of a reflective polarizer, according to an embodiment of the present disclosure.
Figure 3:
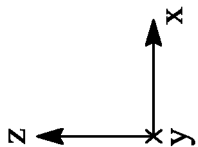

FIG. 3 illustrates a schematic side view of the reflective polarizer 40 according to an embodiment of the present disclosure. In some embodiments, the reflective polarizer 40 is an Advanced Polarizing Filter (APF). However, the reflective polarizer 40 may be any suitable reflective polarizer. In some embodiments, the reflective polarizer 40 may include one or more of a multilayer polymeric reflective polarizer, a wire grid reflective polarizer, and a diffuse reflective polarizer. In some embodiments, light reflected from the reflective polarizer 40 may be recycled by the optically reflective surface 30 (shown in FIG. 1).

The reflective polarizer 40 includes a plurality of polymeric layers 60, 61 numbering at least 10 in total. In some embodiments, the reflective polarizer 40 includes the plurality of polymeric layers 60, 61 numbering at least 50, at least 100, at least 200, at least 300, at least 400, or at least 500 in total. In the illustrated embodiment of FIG. 3, the reflective polarizer 40 includes the plurality of polymeric layers 60, 61 disposed in an alternating configuration. Specifically, the polymeric layers 60, 61 form alternating polymeric layers along the z-axis. Each of the polymeric layers 60, 61 has an average thickness of less than about 500 nm. In some embodiments, each of the polymeric layers 60, 61 has the average thickness of less than about 400 nm, less than about 300 nm, or less than about 200 nm. The average thickness is measured along the z-axis.

In some embodiments, one of the polymeric layers 60, 61 includes a material with a high refractive index relative to the other. In some embodiments, at least one of the polymeric layers 60, 61 includes a birefringent material. In some embodiments, the reflective polarizer 40 may further include at least one intermediate layer (not shown) disposed between the plurality of polymeric layers 60, 61. In some embodiments, the intermediate layer may include a material with a low refractive index.

In some embodiments, the reflective polarizer 40 further includes at least one skin 63 disposed on the plurality of polymeric layers 60, 61 thereof. In the illustrated embodiment of FIG. 3, the reflective polarizer 40 includes skins 63 on both major surfaces of the reflective polarizer 40. Specifically, the plurality of polymeric layers 60, 61 are disposed between the skins 63. The at least one skin 63 may protect the plurality of polymeric layers 60, 61, and may also provide mechanical stability to the reflective polarizer 40. In some cases, the at least one skin 63 may act as protective boundary layer (PBL). In some embodiments, the at least one skin 63 has an average thickness of greater than about 500 nm. In some embodiments, the at least one skin 63 has the average thickness of greater than about 750 nm, or greater than about 1000 nm.

As shown in FIG. 3, a substantially collimated incident light 70 propagating in an incident plane P is incident on a major surface 41 of the reflective polarizer 40 at a first incident angle $\alpha 1$ with respect to a normal $N_R$ to the major surface 41. The incident plane P may substantially correspond to the x-z plane. The normal $N_R$ may lie in the incident plane P. In some embodiments, the first incident angle $\alpha 1$ is less than about 5 degrees. In some embodiments, the first incident angle $\alpha 1$ is less than about 4 degrees, less than about 3 degrees, less than about 2 degrees, or less than about 1 degree. However, the incident light 70 may be incident on the reflective polarizer 40 at any oblique angle. In some embodiments, "substantially collimated incident light 70" may be interchangeably referred to as "incident light 70".

Figure 4:
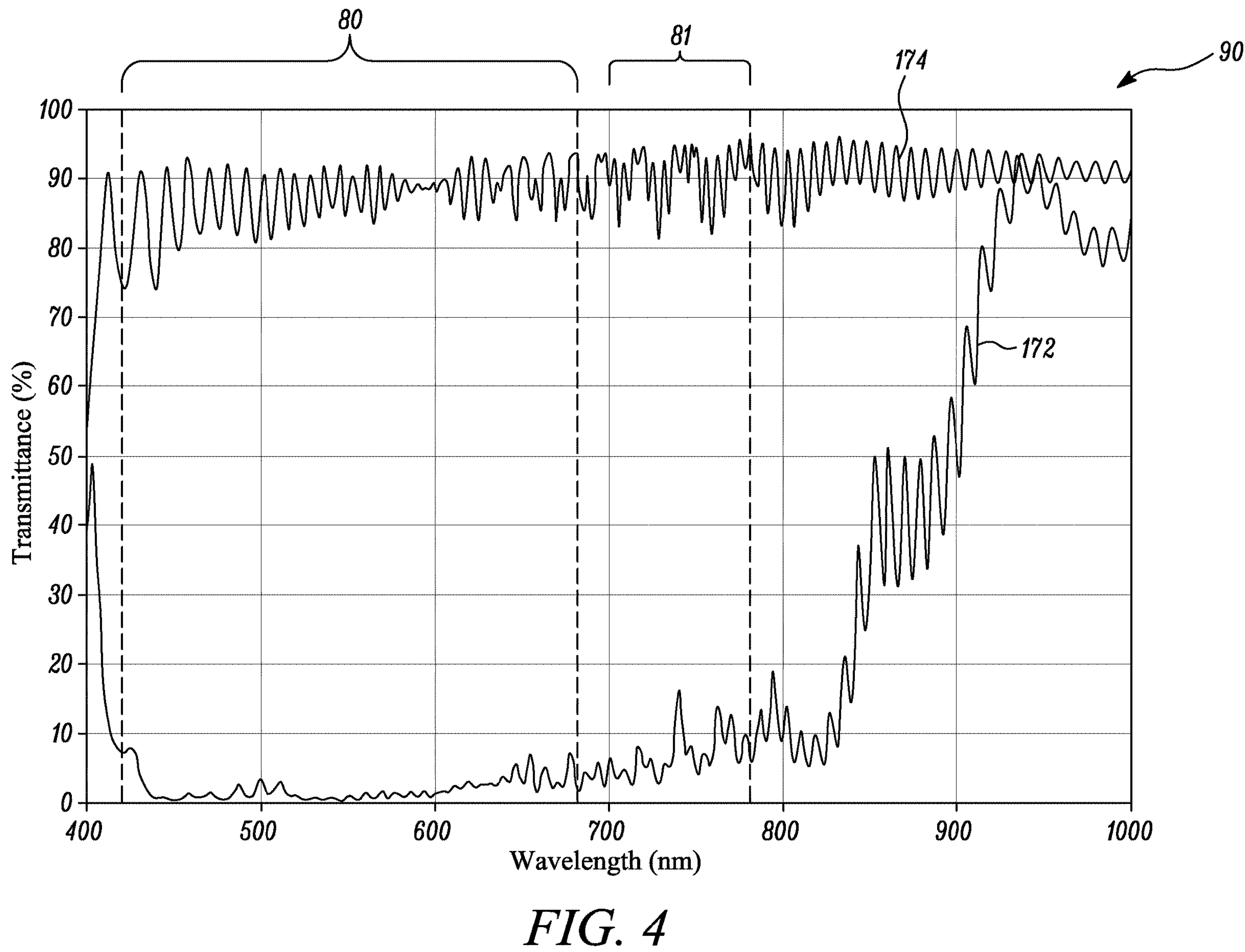
FIG. 4 is a graph depicting optical transmittance versus wavelength for different polarization states of light incident on the reflective polarizer, according to an embodiment of the present disclosure.

FIG. 4 is an exemplary graph 90 depicting optical transmittance versus wavelength of the reflective polarizer 40 (shown in FIG. 3) for different polarization states of incident light. Wavelength is expressed in nanometers (nm) in the abscissa. Wavelength includes the visible wavelength range 80 and an infrared wavelength range 81 extending from about 700 nm to about 780 nm. Optical transmittance is expressed as a transmittance percentage in the left ordinate. Reflectance is expressed as a reflectance percentage in the right ordinate. The reflectance percentage is complementary to the transmittance percentage, i.e., the reflectance percentage=(100−transmittance percentage).

The graph 90 includes a curve 172 and a curve 174. The curve 172 depicts optical transmittance versus wavelength of the reflective polarizer 40 when the incident light 70 is p-polarized. The curve 174 depicts optical transmittance versus wavelength of the reflective polarizer 40 when the incident light 70 is s-polarized.

Referring to FIGS. 3 and 4, as is apparent from the curve 172, for the substantially collimated incident light 70 propagating in the incident plane P, for the visible wavelength range 80, and for the first incident angle $\alpha 1$ of less than about 5 degrees, the plurality of polymeric layers 60, 61 of the reflective polarizer 40 has an average optical reflectance $R_{avg}$ of at least 60% when the incident light 70 is p-polarized. In some embodiments, for the substantially collimated incident light 70 propagating in the incident plane P, for the visible wavelength range 80, and for the first incident angle $\alpha 1$ of less than about 5 degrees, the plurality of polymeric layers 60, 61 of the reflective polarizer 40 has the average optical reflectance $R_{avg}$ of at least 70%, at least 80%, at least 90%, or at least 95% when the incident light 70 is p-polarized.

As is apparent from the curve 174, for the substantially collimated incident light 70 propagating in the incident plane P, for the visible wavelength range 80, and for the first incident angle $\alpha 1$ of less than about 5 degrees, the plurality of polymeric layers 60, 61 of the reflective polarizer 40 has an average optical transmittance $T_{avg}$ of at least 60% when the incident light 70 is s-polarized. In some embodiments, for the substantially collimated incident light 70 propagating in the incident plane P, for the visible wavelength range 80, and for the first incident angle $\alpha 1$ of less than about 5 degrees, the plurality of polymeric layers 60, 61 of the reflective polarizer 40 has the average optical transmittance $T_{avg}$ of at least 70%, at least 80%, at least 90%, or at least 95% when the incident light 70 is s-polarized.

Figure 5:
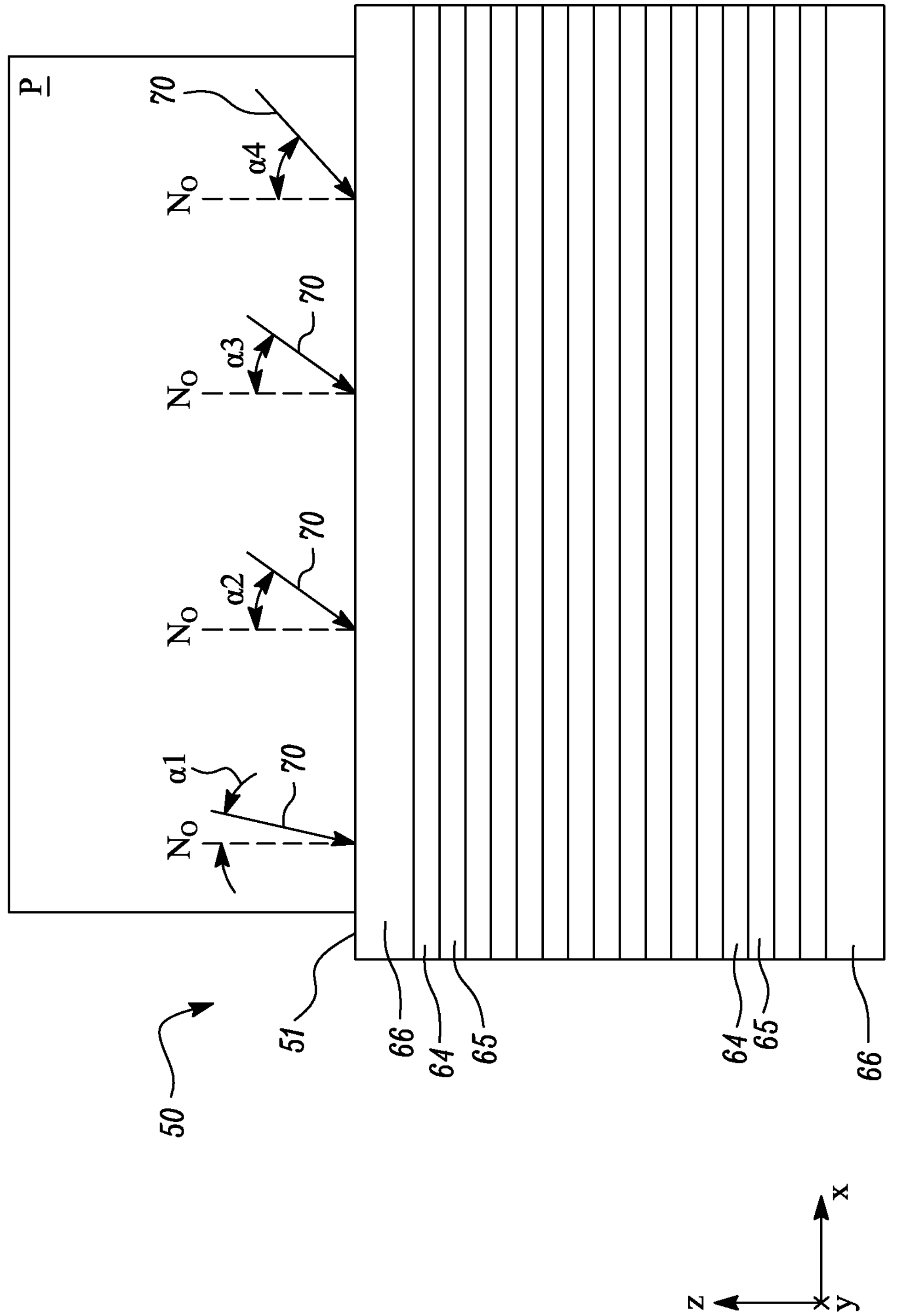
FIG. 5 illustrates a schematic side view of an optical film, according to an embodiment of the present disclosure.

FIG. 5 illustrates a schematic side view of the optical film 50. The optical film 50 includes a plurality of polymeric layers 64, 65 numbering at least 10 in total. In some embodiments, the optical film 50 includes the plurality of polymeric layers 64, 65 numbering at least 50, at least 100, at least 200, at least 300, at least 400, or at least 500 in total. In the illustrated embodiment of FIG. 5, the optical film 50 includes the plurality of polymeric layers 64, 65 disposed in an alternating configuration. Specifically, the polymeric layers 64, 65 form alternating polymeric layers along the z-axis. Each of the polymeric layers 64, 65 has an average thickness of less than about 500 nm. In some embodiments, each of the polymeric layers 64, 65 has the average thickness of less than about 400 nm, less than about 300 nm, or less than about 200 nm.

In some embodiments, one of the polymeric layers 64, 65 includes a material with a high refractive index relative to the other. In some embodiments, at least one of the polymeric layers 64, 65 includes a birefringent material. In some embodiments, the optical film 50 may further include at least one intermediate layer (not shown) disposed between the plurality of polymeric layers 64, 65. In some embodiments, the intermediate layer may include a material with a low refractive index.

In some embodiments, the optical film 50 further includes at least one skin 66 disposed on the plurality of polymeric layers 64, 65 thereof. In the illustrated embodiment of FIG. 5, the optical film 50 includes skins 66 on both major surfaces of the optical film 50. Specifically, the plurality of polymeric layers 64, 65 are disposed between the skins 66. The at least one skin 66 may protect the plurality of polymeric layers 64, 65, and may also provide mechanical stability to the optical film 50. In some cases, the at least one skin 66 may act as PBL. In some embodiments, the at least one skin 66 has an average thickness of greater than about 500 nm. In some embodiments, the at least one skin 66 has the average thickness of greater than about 750 nm or greater than about 1000 nm.

As shown in FIG. 5, the incident light 70 propagating in the incident plane P may be incident on the optical film 50 at the first incident angle $\alpha 1$ of less than about 5 degrees, and a second incident angle $\alpha 2$ of greater than about 35 degrees, relative to a normal No to a major surface 51 of the optical film 50. The incident plane P may substantially correspond to the x-z plane. The normal No may lie in the incident plane P. In some embodiments, the first incident angle $\alpha 1$ is less than about 4 degrees, less than about 3 degrees, less than about 2 degrees, or less than about 1 degree. In some embodiments, the second incident angle $\alpha 2$ is greater than about 40 degrees, greater than about 45 degrees, greater than about 50 degrees, or greater than about 55 degrees. In some embodiments, the incident light 70 propagating in the incident plane P is incident on the optical film 50 at a third incident angle $\alpha 3$ of between about 20 degrees and about 40 degrees relative to the normal No to the major surface 51 of the optical film 50. In some embodiments, the third incident angle $\alpha 3$ is between about 25 degrees and about 35 degrees. In some embodiments, the incident light 70 propagating in the incident plane P is incident on the optical film 50 at a fourth incident angle $\alpha 4$ of greater than about 45 degrees relative to the normal No to the major surface 51 of the optical film 50. In some embodiments, the fourth incident angle $\alpha 4$ is greater than about 50 degrees, or greater than about 55 degrees.

Figure 6:
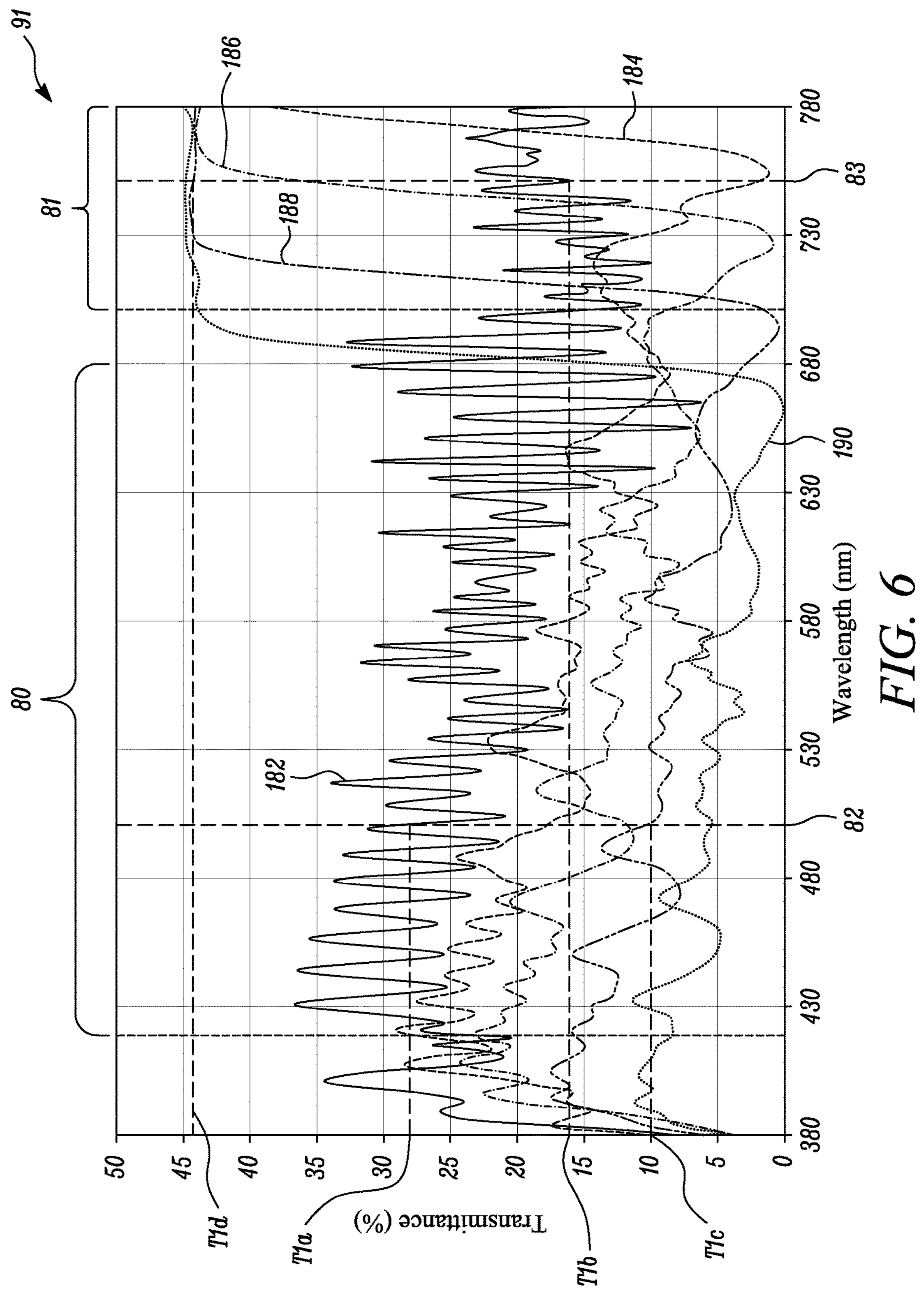
FIG. 6 is a graph depicting optical transmittance versus wavelength for light incident on the optical film at different angles, according to an embodiment of the present disclosure.

FIG. 6 is an exemplary graph 91 depicting optical transmittance versus wavelength of the optical film 50 (shown in FIG. 5) corresponding to different incident angles. Wavelength is expressed in nanometers (nm) in the abscissa. Wavelength includes the visible wavelength range 80 and the infrared wavelength range 81. Optical transmittance is expressed as a transmittance percentage in the left ordinate.

The graph 91 includes a curve 182, a curve 184, a curve 186, a curve 188, and a curve 190. Referring to FIGS. 5 and 6, the curve 182 depicts optical transmittance versus wavelength of the optical film 50 for a light incident at 0 degree relative to the normal No to the major surface 51 of the optical film 50 and for the average of p-polarized and s-polarized incident lights (i.e., light linearly polarized in the plane of incidence and perpendicular to the plane of incidence, respectively). The curve 184 depicts optical transmittance versus wavelength of the optical film 50 for a light incident at 30 degrees relative to the normal No to the major surface 51 of the optical film 50 and for the average of p-polarized and s-polarized incident lights. The curve 186 depicts optical transmittance versus wavelength of the optical film 50 for a light incident at 40 degrees relative to the normal No to the major surface 51 of the optical film 50 and for the average of p-polarized and s-polarized incident lights. The curve 188 depicts optical transmittance versus wavelength of the optical film 50 for a light incident at 50 degrees relative to the normal No to the major surface 51 of the optical film 50 and for the average of p-polarized and s-polarized incident lights. The curve 190 depicts optical transmittance versus wavelength of the optical film 50 for a light incident at 60 degrees relative to the normal No to the major surface 51 of the optical film 50 and for the average of p-polarized and s-polarized incident lights.

Figures 7A, 7B:
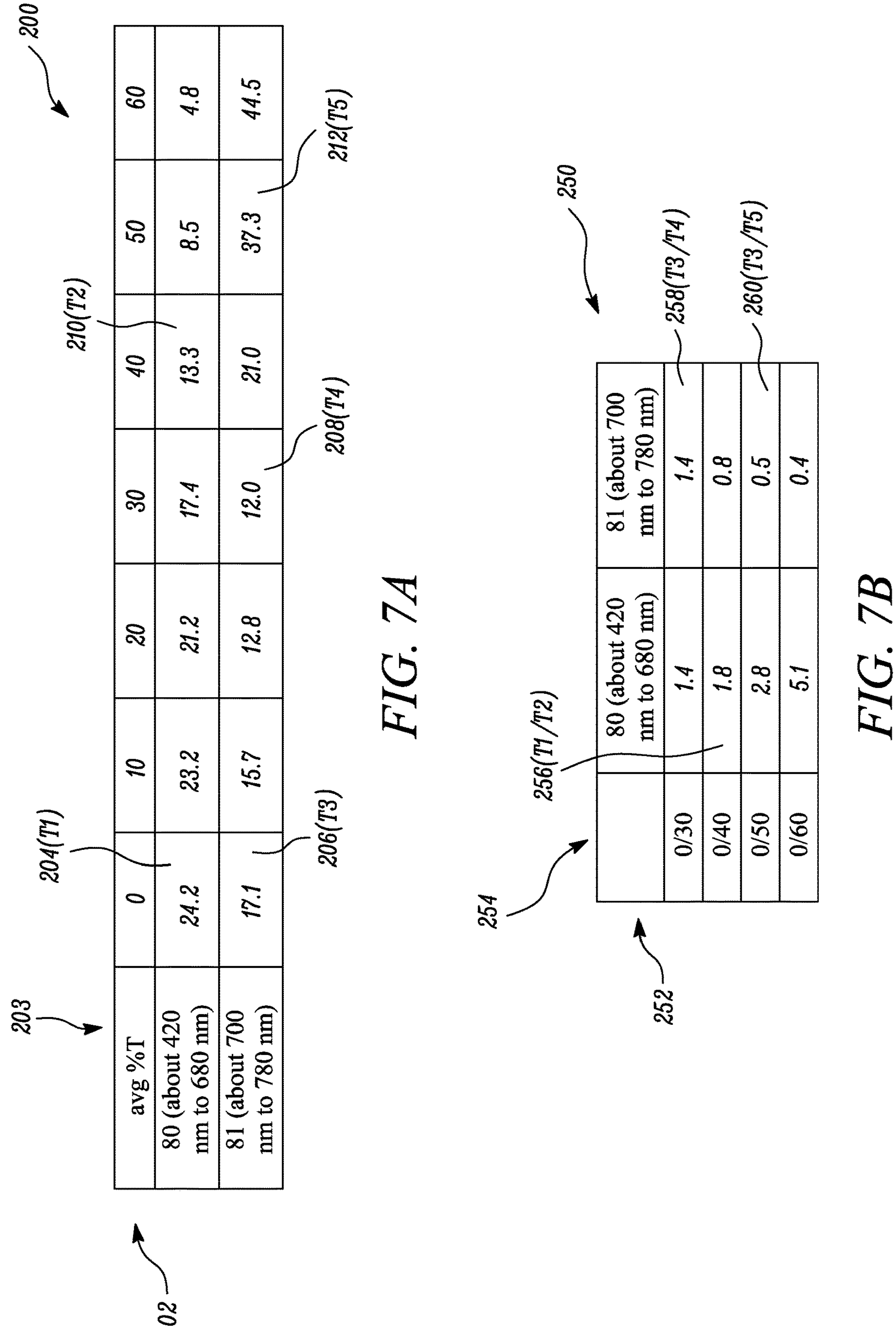
FIG. 7A shows a table listing values of average optical transmittance of the optical film for different wavelength ranges and for light incident on the optical film at different angles corresponding to the graph of FIG. 6.
FIG. 7B shows a table listing values for a ratio of an average optical transmittance for substantially normally incident light to an average optical transmittance corresponding to various angles of light incident on the optical film, according to an embodiment of the present disclosure.

FIGS. 7A and 7B illustrate tables 200 and 250, respectively. The table 200 lists exemplary values of average optical transmittance for the visible wavelength range 80 and for the infrared wavelength range 81 at different angles of light incident on the optical film 50 (shown in FIGS. 1 and 5) corresponding to the graph 91 shown in FIG. 6. The table 200 includes multiple column headings in a row 202. The column headings in the row 202 includes different angles of light incident on the optical film 50. A column 203 indicates the visible wavelength range 80 (about 420 nm to about 680 nm) and the infrared wavelength range 81 (about 700 nm to about 780 nm). The table 200 further incudes multiple cells corresponding to different values of the average optical transmittance for the visible wavelength range 80 and for the infrared wavelength range 81 at different angles of light incident on the optical film 50.

The table 200 includes cells 204 and 206 indicative of values of an average optical transmittance T1 and an average optical transmittance T3 corresponding to the visible wavelength range 80 (about 420 nm to about 680 nm) and the infrared wavelength range 81 (about 700 nm to about 780 nm), respectively, and for the substantially normally incident light (angle of incidence less than about 5 degrees). Further, the table 200 includes a cell 208 indicative of a value of an average optical transmittance T4 for the infrared wavelength range 81 and for the light incident at 30 degrees relative to the normal No, a cell 210 indicative of a value of an average optical transmittance T2 for the visible wavelength range 80 and for the light incident at 40 degrees relative to the normal No, a cell 212 indicative of a value of an average optical transmittance T5 for the infrared wavelength range 81 and for the light incident at 50 degrees relative to the normal No.

The table 250 lists exemplary values for a ratio of an average optical transmittance for the substantially normally incident light (angle of incidence less than about 5 degrees) to an average optical transmittance corresponding to various angles of light incident on the optical film 50. The table 250 includes multiple column headings in a row 252. The column headings in the row 252 includes the visible wavelength range 80 (about 420 nm to about 680 nm) and the infrared wavelength range 81 (about 700 nm to about 780 nm). A column 254 indicates the ratios of the average optical transmittance for the substantially normally incident light (angle of incidence less than about 5 degrees) to the average optical transmittance corresponding to various angles of light incident on the optical film 50 for the visible wavelength range 80 and the infrared wavelength range 81. The table 250 further incudes multiple cells corresponding to different values of the ratio of the average optical transmittance for the substantially normally incident light to the average optical transmittance corresponding to various angles of light incident on the optical film 50 for the visible wavelength range 80 and the infrared wavelength range 81.

The table 250 includes a cell 256 indicative of a ratio of the average optical transmittance T1 to the average optical transmittance T2 for the visible wavelength range 80, a cell 258 indicative of a ratio of the average optical transmittance T3 to the average optical transmittance T4 for the infrared wavelength range 81, and a cell 260 indicative of a ratio of the average optical transmittance T3 to the average optical transmittance T5 for the infrared wavelength range 81.

Referring now to FIGS. 5-7B and the curve 182, for the substantially collimated incident light 70 propagating in the incident plane P, for the first incident angle $\alpha 1$ (about 0 degree), and for the average of p-polarized and s-polarized incident lights, the plurality of polymeric layers 64, 65 of the optical film 50 has an optical transmittance T1a at at least one visible wavelength 82 in the visible wavelength range 80 and an optical transmittance T1b at at least one infrared wavelength 83 in the infrared wavelength range 81. Further, for the substantially collimated incident light 70 propagating in the incident plane P, for the visible wavelength range 80, for the first incident angle $\alpha 1$, and for the average of p-polarized and s-polarized incident lights, the plurality of polymeric layers 64, 65 of the optical film 50 has the average optical transmittance T1. Moreover, for the average of p-polarized and s-polarized incident lights propagating in the incident plane P, and for the infrared wavelength range 81, the plurality of polymeric layers 64, 65 of the optical film 50 has the average optical transmittance T3 for the first incident angle $\alpha 1$.

Referring to the curves 184, 186, for the average of p-polarized and s-polarized incident lights propagating in the incident plane P, and for the infrared wavelength range 81, the plurality of polymeric layers 64, 65 of the optical film 50 has the average optical transmittance T4 for the third incident angle $\alpha 3$ of between about 20 degrees and about 40 degrees, or between about 25 degrees and about 35 degrees.

Further, referring to the curve 188, for the substantially collimated incident light 70 propagating in the incident plane P, for the second incident angle $\alpha 2$ of greater than about 35 degrees, and for the average of p-polarized and s-polarized incident lights, the plurality of polymeric layers 64, 65 of the optical film 50 has an optical transmittance T1c at the at least one visible wavelength 82 and an optical transmittance T1d at the at least one infrared wavelength 83 in the infrared wavelength range 81. Further, for the substantially collimated incident light 70 propagating in the incident plane P, for the visible wavelength range 80, for the second incident angle $\alpha 2$ of greater than about 35 degrees and for the average of p-polarized and s-polarized incident lights, the plurality of polymeric layers 64, 65 of the optical film 50 has the average optical transmittance T2.

Referring to the curves 188, 190, for the average of p-polarized and s-polarized incident lights propagating in the incident plane P, and for the infrared wavelength range 81, the plurality of polymeric layers 64, 65 of the optical film 50 has the average optical transmittance T5 for the fourth incident angle $\alpha 4$ of greater than about 45 degrees, greater than about 50 degrees, or greater than about 55 degrees.

As is apparent from the graph 91, the optical transmittance T1a is greater than or equal to 1.5 times the optical transmittance T1c, i.e., $T1a/T1c \geq 1.5$. In some embodiments, $T1a/T1c \geq 1.8$, $T1a/T1c \geq 2$, $T1a/T1c \geq 2.5$, $T1a/T1c \geq 3$, $T1a/T1c \geq 3.5$, $T1a/T1c \geq 4$, $T1a/T1c \geq 4.5$, or $T1a/T1c \geq 5$. Further, the optical transmittance T1b is less than or equal to 0.7 times the optical transmittance T1d, i.e., $T1b/T1d \leq 0.7$. In some embodiments, $T1b/T1d \leq 0.6$, or $T1b/T1d \leq 0.5$.

Further, as is apparent from the graph 91 and the tables 200 and 250, the average optical transmittance T1 is greater than or equal to 1.5 times the average optical transmittance T2, i.e., $T1/T2 \geq 1.5$. In some embodiments, $T1/T2 \geq 1.8$, $T1/T2 \geq 2$, $T1/T2 \geq 2.5$, $T1/T2 \geq 3$, $T1/T2 \geq 3.5$, $T1/T2 \geq 4$, $T1/T2 \geq 4.5$, or $T1/T2 \geq 5$. Further, the average optical transmittance T3 is greater than or equal to the average optical transmittance T4, i.e., $T3/T4 \geq 1$. In some embodiments, $T3/T4 \geq 1.1$, $T3/T4 \geq 1.2$, or $T3/T4 \geq 1.3$. Further, the average optical transmittance T3 is less than or equal to 0.7 times the average optical transmittance T5, i.e., $T3/T5 \leq 0.7$. In some embodiments, $T3/T5 \leq 0.6$, or $T3/T5 \leq 0.5$.

Referring now to FIGS. 1, 5-7B, for the visible wavelength range 80, the optical film 50 therefore has the average transmittance T1 for the substantially collimated incident light 70 propagating in the incident plane P and incident at the first incident angle $\alpha 1$ of less than about 5 degrees (i.e., substantially normally incident light or an on-axis light). Further, for the visible wavelength range 80, the optical film 50 has the average transmittance T2 for the substantially collimated incident light 70 propagating in the incident plane P and incident at the second incident angle $\alpha 2$ of greater than about 35 degrees (i.e., an off-axis light). The average transmittance T1 is greater than the average transmittance T2. Therefore, for the visible wavelength range 80, the optical film 50 may have a greater reflectance for the substantially collimated incident light 70 propagating in the incident plane P and incident at the second incident angle $\alpha 2$. Thus, for the visible wavelength range 80, the optical film 50 may substantially reflect the substantially collimated incident light 70 propagating in the incident plane P and incident at the second incident angle $\alpha 2$ back toward the optically reflective surface 30 of the backlight 300. The optical film 50 may act as a collimating multilayer optical film (CMOF) with a greater transmittance for the on-axis light than the off-axis light.

Reflected light from the optical film 50 may be recycled by the optically reflective surface 30 of the backlight 300. The optically reflective surface 30 may redirect the reflected light toward the optical film 50 until the redirected light is substantially normally incident on the optical film 50 (i.e., incident along a direction closer to an on-axis of the backlight 300). The optical film 50 of the backlight 300 may therefore at least partially collimate and recycle the off-axis light generated by the plurality of discrete spaced apart light sources 20 or the off-axis light redirected by the optically reflective surface 30, between the optical film 50 and the optically reflective surface 30 of the backlight 300. The increased recycling may therefore result in improved light use efficiency and increased brightness of illumination from the backlight 300. Further, the recycling of the off-axis light may further improve a uniformity of backlight illumination. This may further help in reducing a thickness of the backlight 300 since the backlight 300 exhibits good performance balance between brightness, uniformity and light use efficiency compared to other backlights with similar thickness.

Further, for the infrared wavelength range 81, the optical film 50 has the average transmittance T3 for the substantially collimated incident light 70 propagating in the incident plane P and incident at the first incident angle $\alpha 1$ of less than about 5 degrees. For the infrared wavelength range 81, the optical film 50 has the average transmittance T4 for the substantially collimated incident light 70 propagating in the incident plane P and incident at the third incident angle $\alpha 3$ of between about 20 degrees and about 40 degrees. For the infrared wavelength range 81, the optical film 50 has the average transmittance T5 for the substantially collimated incident light 70 propagating in the incident plane P and incident at the fourth incident angle $\alpha 4$ of greater than about 45 degrees. The average transmittance T3 is greater than the average transmittance T4. However, the average transmittance T5 is greater than the average transmission T3. Therefore, the average transmittance of the optical film 50 in the infrared wavelength range 81 may decrease from substantially normally incidence (e.g., the first incident angle $\alpha 1$) to an incident angle between about 20 degrees and about 40 degrees (e.g., the third incident angle $\alpha 3$). However, the average transmittance of the optical film 50 in the infrared wavelength range 81 may increase with an increase in the incident angle above 45 degrees (e.g., the fourth incident angle $\alpha 4$). Therefore, the average transmittance of the optical film 50 in the infrared range 81 may increase or decrease in various ranges of the incident angle.

Figure 8B:
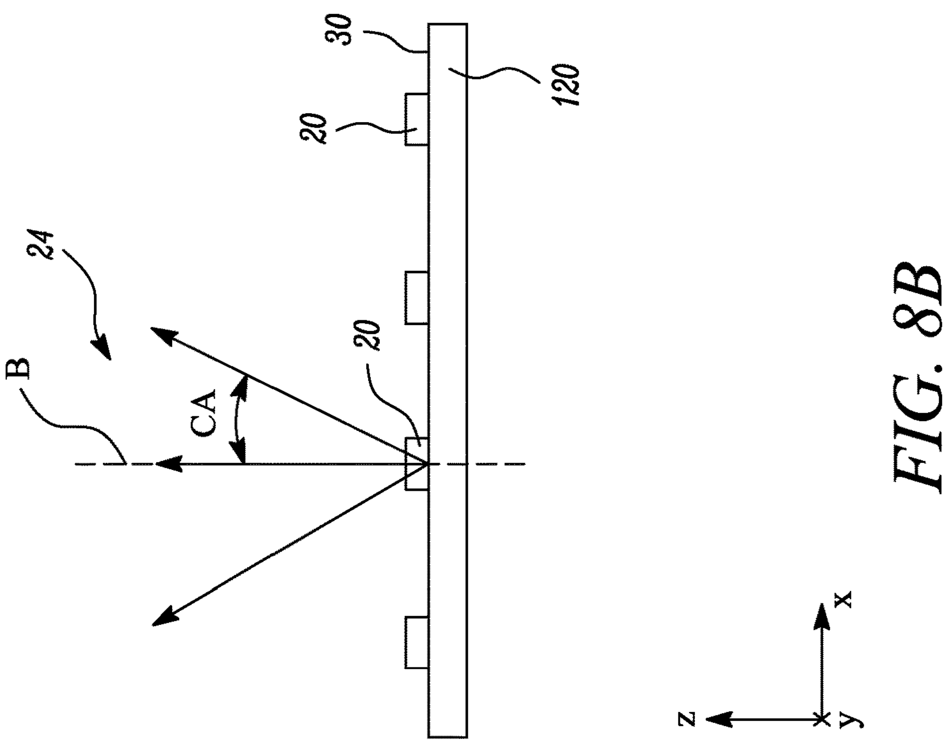
FIG. 8B illustrates a schematic side view of the plurality of discrete spaced apart light sources and a circuit board, according to an embodiment of the present disclosure.
Figure 8A:
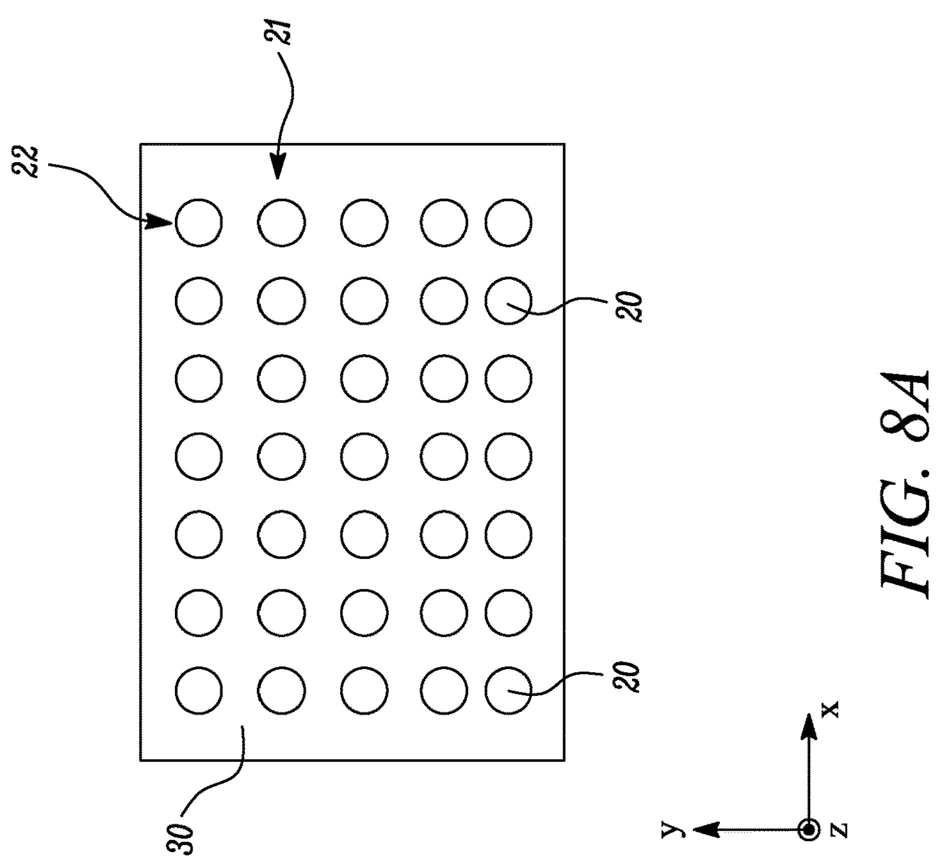
FIG. 8A illustrates a schematic top view of a plurality of discrete spaced apart light sources disposed on an optically reflective surface, according to an embodiment of the present disclosure.

FIG. 8A illustrates a schematic top view of the plurality of discrete spaced apart light sources 20 disposed on the optically reflective surface 30. In the illustrated embodiment of FIG. 8A, the light sources are arranged in a regular two-dimensional array of light sources 20 forming rows 21 and columns 22 of the light sources 20. In some embodiments, the sources may be arranged in a hexagonal array or other irregular patterns. In general, each light source 20 from the plurality light sources 20 may include a single LED, a pair of LEDs, 2-10 LEDs or any number of LEDs. In the illustrated embodiment of FIG. 8A, a single LED is shown representing each light source 20. Further, the light sources 20 are shown substantially circular in shape. However, the light sources 20 may have any suitable shape, for example, a square shape, a rectangle shape, an elliptical shape, a polygonal shape, etc. In some embodiments, the light sources 20 may have same or different sizes based on desired application attributes.

In some embodiments, each light source 20 may be covered by an encapsulant of different shape or an encapsulant with different dopants. In some embodiments, the encapsulant may include color conversion materials, such as phosphorescent materials or quantum dots. In some embodiments, some light sources 20 from the plurality of discrete spaced apart light sources 20 may have different properties to tune the light that is emitted from the light sources 20. In some embodiments, some light sources 20 from the plurality of discrete spaced apart light sources 20 may emit red, blue, green, or white light.

In some embodiments, the circuit board 120 (shown in FIG. 1) may include the optically reflective surface 30. The light sources 20 may be mounted on the circuit board 120 by any suitable attachment mechanism (e.g., soldering) and may be arranged using any suitable arrangement based on desired application attributes.

FIG. 8B illustrates a schematic side view of the light sources 20 and the circuit board 120. In some embodiments, light emitted by the plurality of light sources 20 and incident on the optical film 50 has a minimum luminance L1 (shown in FIG. 9 as Lmin) and a maximum luminance L2 (shown in FIG. 9 as Lmax) within a cone 24 of emitted light centered on an optical axis B substantially orthogonal to the optically reflective surface 30 with a half cone angle CA of at least 40 degrees. In some embodiments, the half cone angle CA is at least 45 degrees, at least 50 degrees, at least 55 degrees, or at least 60 degrees.

Figure 9:
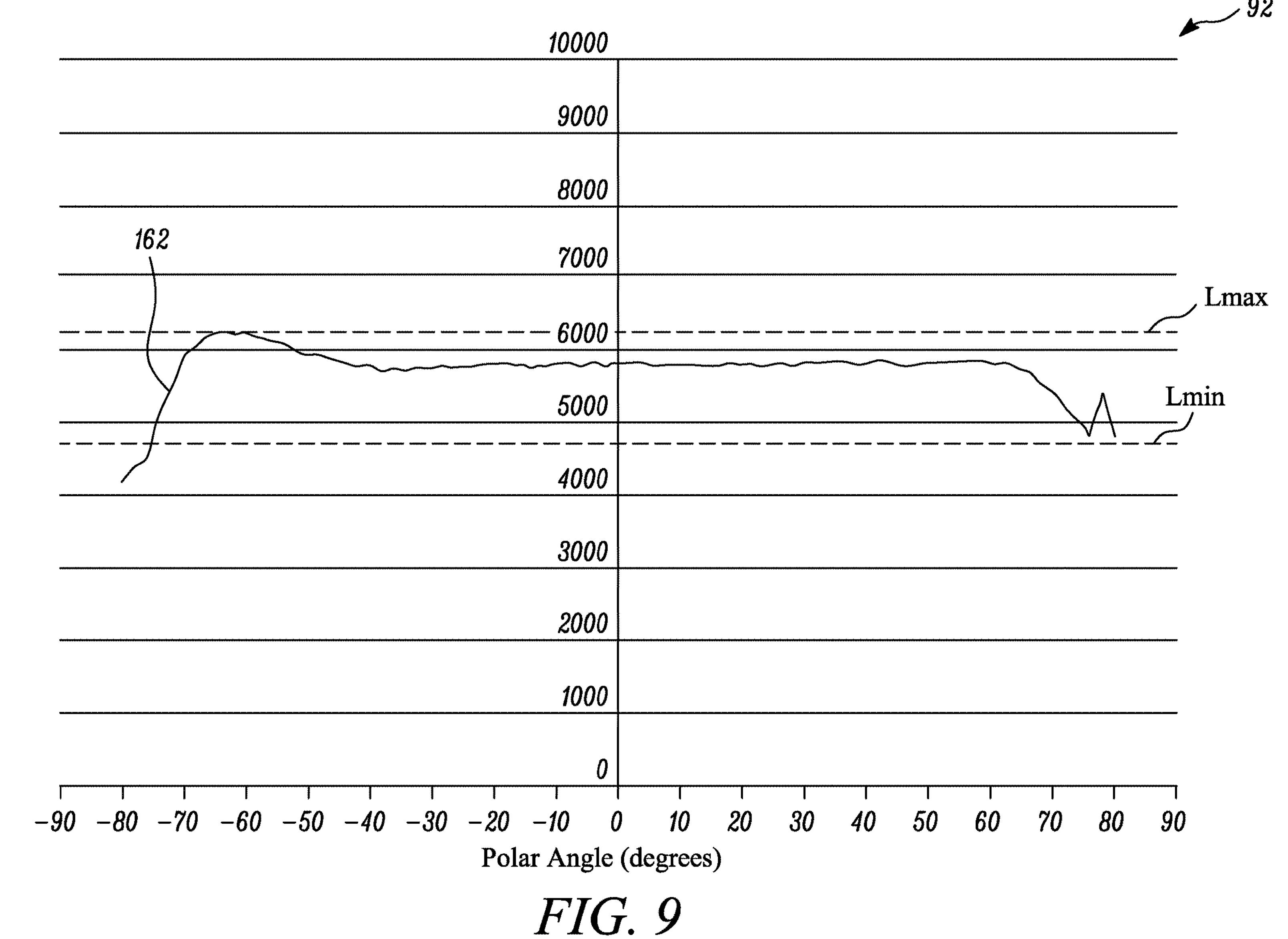
FIG. 9 illustrates a graph showing luminance versus polar angle of a plurality of light sources, after transmission through light converting layer, according to an embodiment of the present disclosure.

FIG. 9 illustrates an exemplary graph 92 including a curve 162 depicting luminance versus polar angle for the plurality of light sources 20 after transmission through the diffuser 130 (shown in FIG. 1) and the color conversion film 100 (shown in FIG. 1). This result is obtained on a partial optical stack to measure the uniformity of the illumination of the backlight 300 (shown in FIG. 1) before entering the optical film 50 (shown in FIG. 1). Polar angle is expressed in degrees in the abscissa. Luminance is expressed in candela per square meter (cd/m 2) in the left ordinate. The polar angle may correspond to a viewer observation angle or the half cone angle CA of the cone 24 (shown in FIG. 8B) of emitted light.

As is apparent from the curve 162, for the polar angles substantially in the range of about −40 degrees to about 40 degrees, the luminance is substantially constant. For the half cone angle CA of at least ±40 degrees, the luminance varies between the minimum luminance L1 and the maximum luminance L2. The minimum luminance L1 is greater than or equal to 0.5 times the maximum luminance L2, i.e., $L1/L2 \geq 0.5$. In some embodiments, $L1/L2 \geq 0.55$, $L1/L2 \geq 0.6$, $L1/L2 \geq 0.65$, $L1/L2 \geq 0.7$, or $L1/L2 \geq 0.75$.

Figures 10A, 10B:
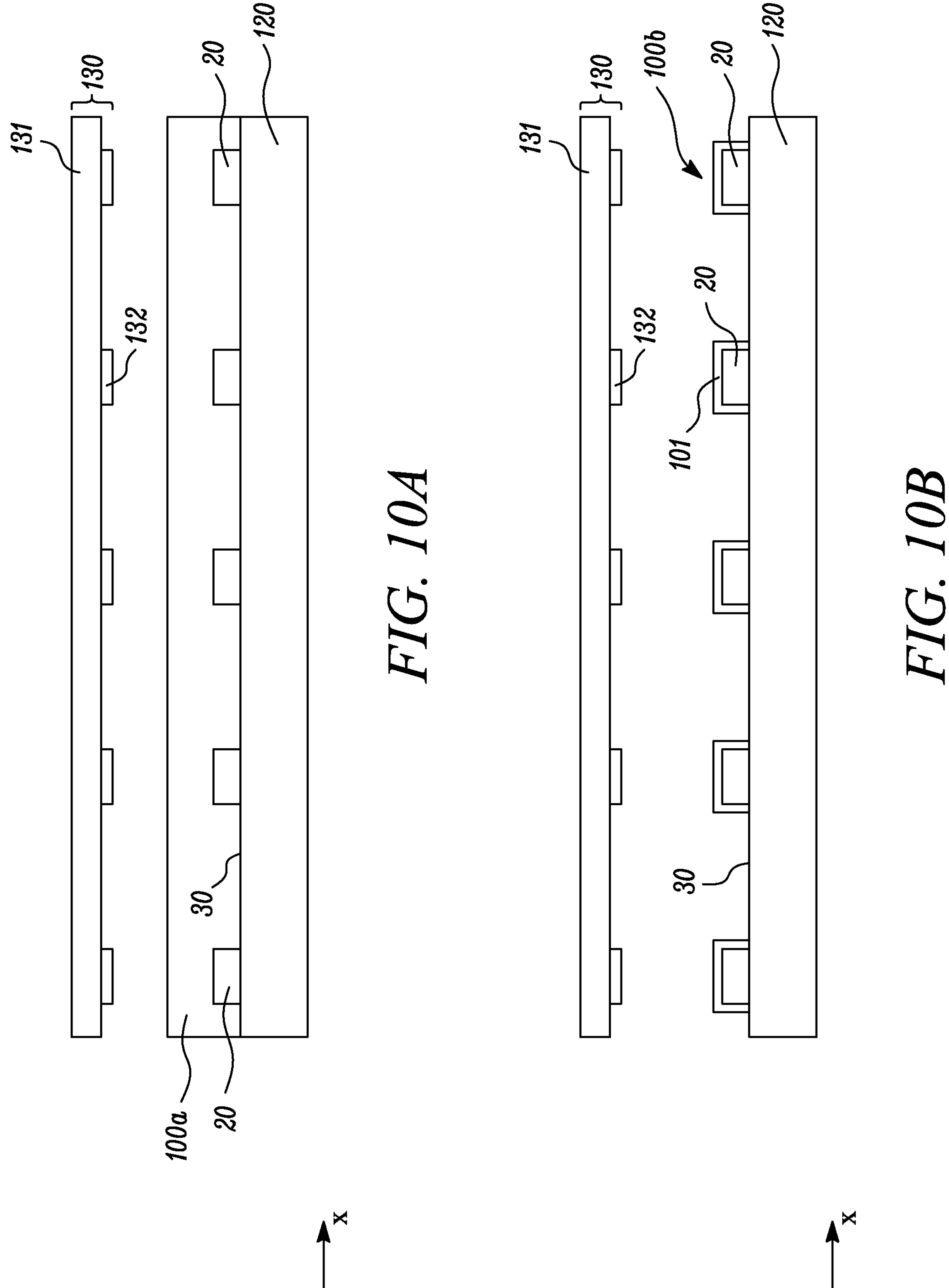
FIG. 10A illustrates a schematic side view of the light sources, a first optically diffusive layer, and a light converting component, according to an embodiment of the present disclosure.
FIG. 10B illustrates a schematic side view of the light sources, the first optically diffusive layer, and the light converting component, according to another embodiment of the present disclosure.

FIG. 10A illustrates a schematic side view of the light sources 20, the first optically diffusive layer 130, and a light converting component 100*a*. The light converting component 100*a* substantially encapsulates the plurality of discrete spaced apart light sources 20. In some embodiments, the light converting component 100*a* may have substantially similar optical properties as the light converting component 100 of FIG. 1. In some embodiments, the light converting component 100*a* may substantially conform to the light sources 20 arranged on the optically reflective surface 30 of the circuit board 120. In some embodiments, the light converting component 100*a* may have any thickness based on desired application attributes.

FIG. 10B illustrates a schematic side view of the light sources 20, the first optically diffusive layer 130, and a light converting component 100*b*. In some embodiments, the light converting component 100*b* may have substantially similar optical properties as the light converting component 100 of FIG. 1. The light converting component 100*b* includes a plurality of discrete light converting component portions 101. Each of the light converting component portions 101 substantially encapsulates a corresponding one of the light sources 20. Thus, each of the light converting component portions 101 may be associated with the corresponding one of the light sources 20. In some embodiments, the plurality of discrete light converting component portions 101 may have any thickness based on desired application attributes.

Figures 11A, 11B:
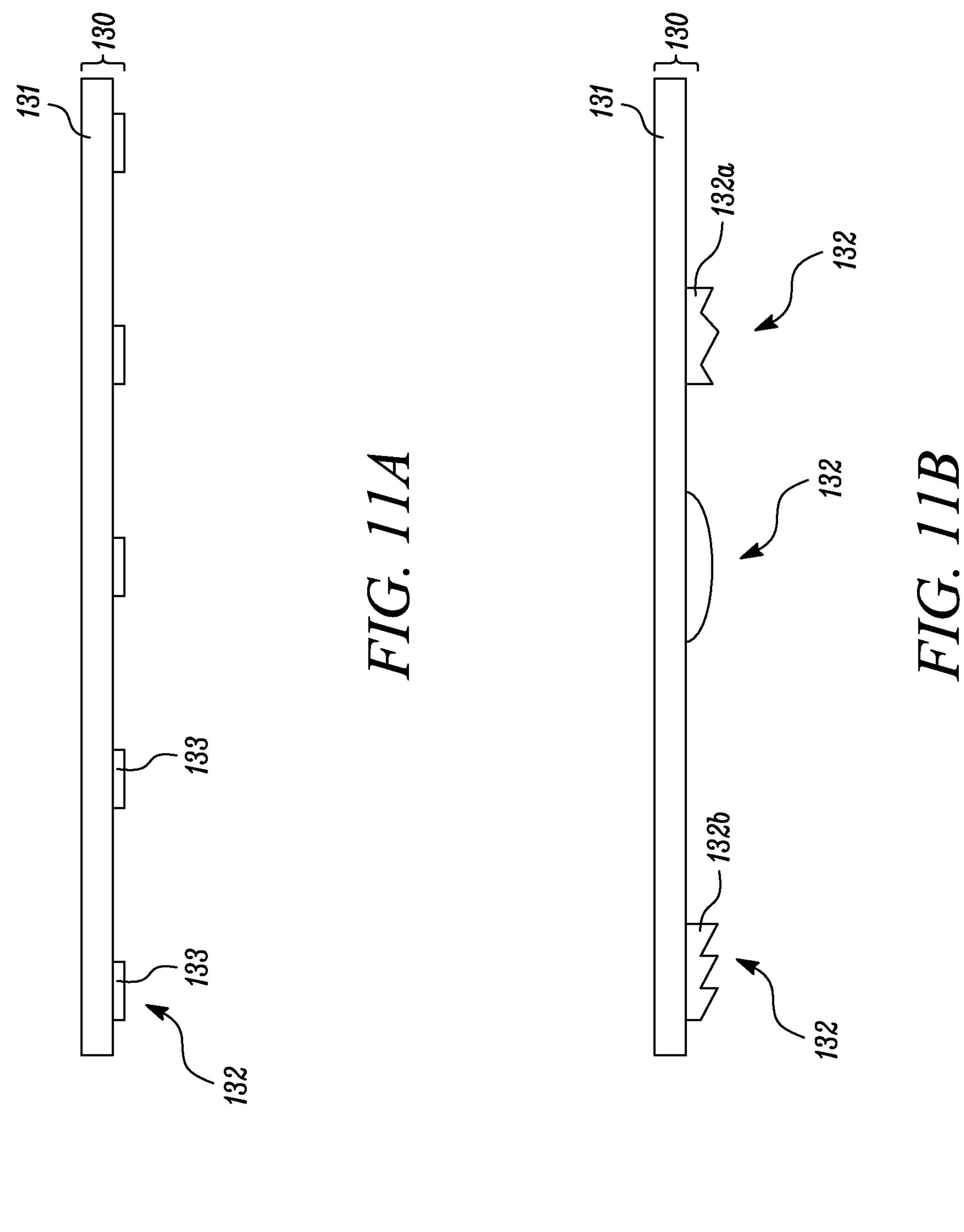
FIG. 11A illustrates a schematic side view of the first optically diffusive layer, according to an embodiment of the present disclosure.
FIG. 11B illustrates a schematic side view of the first optically diffusive layer, according to another embodiment of the present disclosure.

FIGS. 11A and 11B illustrate schematic side views of the first optically diffusive layer 130 according to different embodiments of the present disclosure. The first optically diffusive layer 130 includes the plurality of discrete spaced apart optically diffusive portions 132 disposed on the first substrate 131. Referring to FIG. 11A, at least one of the diffusive portions 132 is primarily a bulk diffuser 133. Generally, in bulk diffusers, small particles, or spheres of a different refractive index are embedded within a primary material of the bulk diffuser. The embedded small particles or spheres act as light scattering elements. In some other embodiments, a refractive index of a material of the bulk diffuser 133 varies across a body of the bulk diffuser 133, thus causing light passing through the material to be refracted or scattered at different points.

Referring to FIG. 11B, at least one of the diffusive portions 132 is primarily a surface diffuser 132*a*. Generally, surface diffusers utilize surface roughness to refract or scatter light in a number of directions. The rough surfaces of the surface diffuser 132*a* may be exposed to air or a surrounding medium, and may cause the largest angular spread for an incident light. In some embodiments, at least two of the diffusive portions 132 are primarily surface diffusers 132*a*, 132*b* and include two different surface structures. It should be understood that the shapes and configurations of the surface diffusers 132*a*, 132*b* as shown in FIG. 11B are exemplary and may vary as per desired application attributes.

Figure 12:
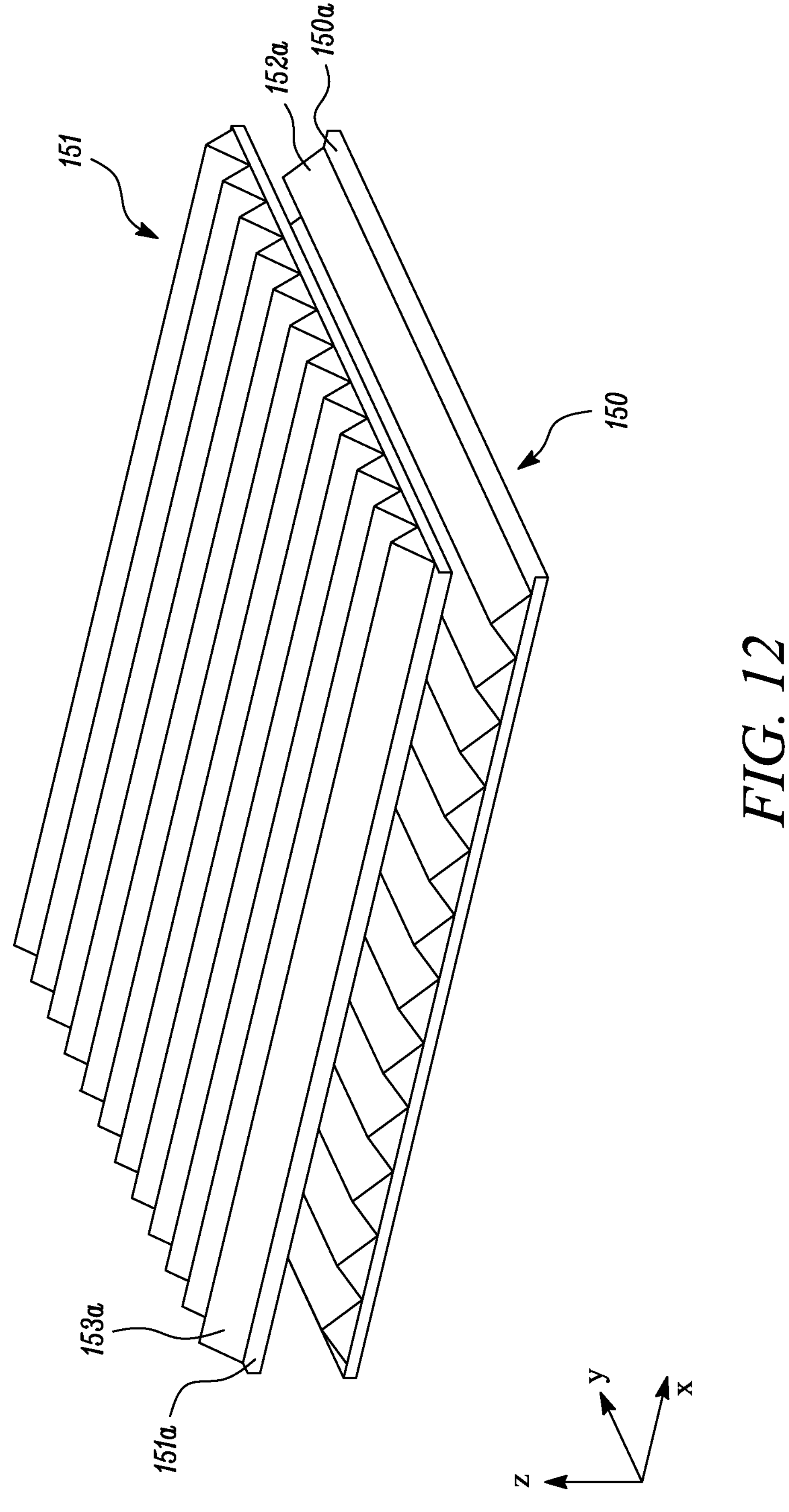
FIG. 12 illustrates a schematic perspective view of light redirecting films, according to an embodiment of the present disclosure.

FIG. 12 illustrates a schematic perspective view of the light redirecting films 150, 151. In some embodiments, the at least one light redirecting film 150, 151 includes first and second prismatic films 150*a*, 151*a*. In some embodiments, the first prismatic film 150*a* includes a plurality of substantially parallel linear first prisms 152*a* extending along the first direction and arranged along the different second direction. The second prismatic film 151*a* includes a plurality of substantially parallel linear second prisms 153*a* extending along a third direction, different from the first direction, and arranged along a different fourth direction. In some embodiments, the first direction and the fourth direction may be disposed substantially along the y-axis. In some embodiments, the second direction and the third direction may be disposed substantially along the x-axis. Thus, the first and second prismatic films 150*a*, 151*a* may be in a crossed configuration (i.e., the second prismatic film 151*a* may be rotated 90 degrees with respect to the first prismatic film 150*a*). In other words, the first prims 152*a* and the second prisms 153*a* are arranged to be perpendicular to each other.

In some embodiments, the first and second prismatic films 150*a*, 151*a* may enhance a brightness of an image (e.g., the image 11) emitted by the display system 400 by at least partially collimating and recycling light emitted by the light sources 20. The first prims 152*a* and the second prisms 153*a* may redirect off-axis light in a direction closer to the on-axis of the display system 400.

EXAMPLES

Example films for the reflective polarizer 40 and the optical film 50 were prepared in accordance with embodiments of the description.

The reflective polarizer 40 was prepared as follows. A single multilayer optical packet was co-extruded. The packet included 275 alternating layers of 90/10 coPEN, a polymer composed of 90% polyethylene naphthalate (PEN) and 10% polyethylene terephthalate (PET), and a low refractive index isotropic layer, which was made with a blend of polycarbonate and copolyesters (PC:coPET). The low refractive index isotropic layer had a refractive index of about 1.57 and remained substantially isotropic upon uniaxial orientation. A molar ratio of the PC:coPET was approximately 42.5 mol % polycarbonate (PC) and 57.5 mol % coPET, and the material had a glass transition temperature (Tg) of 105° C. This isotropic material was chosen such that after stretching, the refractive indices of the isotropic material in two non-stretch directions remained substantially matched with those of the birefringent material in the non-stretching direction, while in the stretching direction there was a substantial mis-match in refractive indices between birefringent and non-birefringent layers.

The 90/10 PEN and PC:coPET polymers were fed from separate extruders to a multilayer coextrusion feedblock, in which they were assembled into a packet of 275 alternating optical layers, and thicker protective boundary layers of the PC:coPET polymer on each side, resulting in a total of 277 layers. After the feedblock, skin layers were added where the polymer used for the skin layers was a second PC:coPET having a molar ratio of 50 mol % polycarbonate and 50 mol % coPET, and having a Tg of 110° C. The multilayer melt was then cast through a film die onto a chill roll, in the conventional manner for polyester films, upon which it was quenched. The cast web was then stretched in a parabolic tenter as described in U.S. Pat. No. 7,104,776 (Merrill et al.) at temperatures and draw ratios (about 6.0) similar to that described in Example 2A of US Patent Application Publication No. 2007/0047080 (Stover et al.).

During the production of the multilayered film, a linear layer profile for a single packet was targeted to best balance optical performance and manufacturing efficiency. The targeted slope was approximately 0.24 nm/layer. The film had a resulting thickness of approximately 26.5 microns as measured by a capacitance gauge.

The optical film 50 was prepared as follows. Optical film 50 was manufactured using the feedblock method described in U.S. Patent Application 61/332,401 entitled "Feedblock for Manufacturing Multilayer Polymeric Films", filed May 7, 2010. Two packets of 275 layers, each of alternating low and high index polymer layers, were coextruded as a cast web and then stretched in a tenter on a continuous film making line. The high index material was a 90/10 coPEN (90% naphthalate units and 10% teraphthalate units). The low index isotropic layer was made with a blend of polycarbonate and copolyesters (PC:coPET). The low index layer had a refractive index of about 1.57 and remained substantially isotropic upon uniaxial orientation. The PC:coPET molar ratio was approximately 42.5 mol % polycarbonate and 57.5 mol % coPET, and the material had a Tg of 105° C.

The 325 alternating microlayers in each packet were arranged in a sequence of ¼ wave layer pairs to produce the transmission spectra shown in FIG. 6. The overall thickness of the film was approximately 76 microns.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A backlight for providing illumination to a display panel, the backlight comprising:
- a plurality of discrete spaced apart light sources arranged two-dimensionally on an optically reflective surface;
- a reflective polarizer disposed on the plurality of discrete spaced apart light sources; and
- an optical film disposed between, and substantially co-extensive in length and width with, the reflective polarizer and the plurality of discrete spaced apart light sources, each of the reflective polarizer and the optical film comprising a plurality of polymeric layers numbering at least 10 in total, each of the polymeric layers having an average thickness of less than about 500 nm,
- such that for a substantially collimated incident light propagating in an incident plane and for a visible wavelength range extending from about 420 nm to about 680 nm:
- for a first incident angle of less than about 5 degrees, the plurality of polymeric layers of the reflective polarizer has an average optical reflectance of at least 60% when the incident light is p-polarized and an average optical transmittance of at least 60% when the incident light is s-polarized;
- for the first incident angle and for the average of p-polarized and s-polarized incident lights, the plurality of polymeric layers of the optical film has an average optical transmittance T1; and
- for a second incident angle of greater than about 35 degrees and for the average of p-polarized and s-polarized incident lights, the plurality of polymeric layers of the optical film has an average optical transmittance T2, T1/T2 ≥1.5.

2. The backlight of claim 1, wherein for the average of p-polarized and s-polarized incident lights propagating in the incident plane and for an infrared wavelength range extending from about 700 nm to about 780 nm, the plurality of polymeric layers of the optical film has:
- an average optical transmittance T3 for the first incident angle;
- an average optical transmittance T4 for a third incident angle of between about 20 degrees and about 40 degrees; and
- an average optical transmittance T5 for a fourth incident angle of greater than about 45 degrees, T3/T4≥1, T3/T5≤0.7.

3. The backlight of claim 1, each light source in the plurality of discrete spaced apart light sources is a blue light emitting light source emitting only blue light, and wherein the backlight further comprises a light converting component disposed between the optical film and the plurality of discrete spaced apart light sources and configured to convert at least a portion of the blue light emitted by the blue light emitting light sources to a green light and convert at least a portion of the blue light emitted by the blue light emitting light sources to a red light.

4. The backlight of claim 1, further comprising a light converting component and a first optically diffusive layer disposed between the optical film and the light sources, wherein a second bonding layer bonds the light converting component to the first optically diffusive layer.

5. The backlight of claim 1, further comprising a second optically diffusive layer disposed between the reflective polarizer and the optical film.

6. The backlight of claim 1, further comprising at least one light redirecting film disposed between the reflective polarizer and the optical film, the at least one light redirecting film redirecting at least one of recycling and collimating light received from the optical film.

7. The backlight of claim 6, wherein at least one of the at least one light redirecting film comprises a plurality of substantially parallel linear prisms extending along a first direction and arranged along a different second direction.

8. The backlight of claim 6, wherein the at least one light redirecting film comprises first and second prismatic films, the first prismatic film comprising a plurality of substantially parallel linear first prisms extending along a first direction and arranged along a different second direction, the second prismatic film comprising a plurality of substantially parallel linear second prisms extending along a third direction, different from the first direction, and arranged along a different fourth direction.

9. The backlight of claim 1, wherein light emitted by the plurality of light sources and incident on the optical film has a minimum luminance L1 and a maximum luminance L2 within a cone of emitted light centered on an optical axis substantially orthogonal to the optically reflective surface with a half cone angle of at least 40 degrees, L1/L2 ≥0.5.

10. A display system comprising:

a plurality of discrete spaced apart light sources arranged two-dimensionally on an optically reflective surface;

a display panel disposed on the light sources and configured to form an image;

a reflective polarizer disposed between the display panel and the light sources; and an optical film disposed between, and substantially co-extensive in length and width with, the reflective polarizer and the light sources, each of the reflective polarizer and the optical film comprising a plurality of polymeric layers numbering at least 10 in total, each of the polymeric layers having an average thickness of less than about 500 nm, such that for a substantially collimated incident light propagating in an incident plane, a visible wavelength range extending from about 420 nm to about 680 nm, and an infrared wavelength range extending from about 700 nm to about 780 nm:

for a first incident angle of less than about 5 degrees and the visible wavelength range, the plurality of polymeric layers of the reflective polarizer has an average optical reflectance of at least 60% when the incident light is p-polarized and an average optical transmittance of at least 60% when the incident light is s-polarized;

for the first incident angle and for the average of p-polarized and s-polarized incident lights, the plurality of polymeric layers of the optical film has an optical transmittance T1a at at least one visible wavelength in the visible wavelength range and an optical transmittance T1b at at least one infrared wavelength in the infrared wavelength range;

for a second incident angle of greater than about 35 degrees and for the average of p-polarized and s-polarized incident lights, the plurality of polymeric layers of the optical film has an optical transmittance T1c at the at least one visible wavelength and an optical transmittance T1d at the at least one infrared wavelength, T1a/T1c≥1.5, T1b/T1d≤0.7.

11. The display system of claim 10, wherein T1a/T1c≥2 and T1b/T1d≤0.6.

12. The display system of claim 10, wherein T1a/T1c≥3 and T1b/T1d≤0.5.

* * * * *